(12) United States Patent
Lee et al.

(10) Patent No.: US 11,664,326 B2
(45) Date of Patent: May 30, 2023

(54) MANUFACTURING METHOD OF A SEMICONDUCTOR MEMORY DEVICE

(71) Applicant: SK hynix Inc., Icheon-si Gyeonggi-do (KR)

(72) Inventors: Kun Young Lee, Seoul (KR); Tae Kyung Kim, Cheongju-si Chungcheongbuk-do (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/715,750

(22) Filed: Apr. 7, 2022

(65) Prior Publication Data

US 2022/0230966 A1    Jul. 21, 2022

Related U.S. Application Data

(62) Division of application No. 16/663,119, filed on Oct. 24, 2019, now Pat. No. 11,309,256.

(30) Foreign Application Priority Data

May 2, 2019    (KR) .................. 10-2019-0051780

(51) Int. Cl.
| H01L 21/66 | (2006.01) |
| H01L 23/544 | (2006.01) |
| H01L 25/00 | (2006.01) |
| H01L 49/02 | (2006.01) |

(52) U.S. Cl.
CPC ............ *H01L 23/544* (2013.01); *H01L 22/14* (2013.01); *H01L 25/50* (2013.01); *H01L 28/60* (2013.01); *H01L 2223/54426* (2013.01)

(58) Field of Classification Search
None
See application file for complete search history.

(56) References Cited

U.S. PATENT DOCUMENTS 11,309,256 B2 *    4/2022    Lee .................. H01L 22/14
2020/0350258 A1    11/2020    Lee et al.

FOREIGN PATENT DOCUMENTS

| CN | 107658315 A | 2/2018 |
| KR | 100962022 B1 | 6/2010 |
| KR | 101899949 B1 | 9/2018 |

* cited by examiner

*Primary Examiner* — Jack S Chen
(74) *Attorney, Agent, or Firm* — William Park & Associates Ltd.

(57) ABSTRACT

A method of manufacturing a semiconductor memory device includes processing a first substrate including a first align mark and a first structure, processing a second substrate including a second align mark and a second structure, orientating the first substrate and the second substrate such that the first structure and the second structure face each other, and controlling alignment between the first structure and the second structure by using the first align mark and the second align mark to couple the first structure with the second structure.

7 Claims, 38 Drawing Sheets

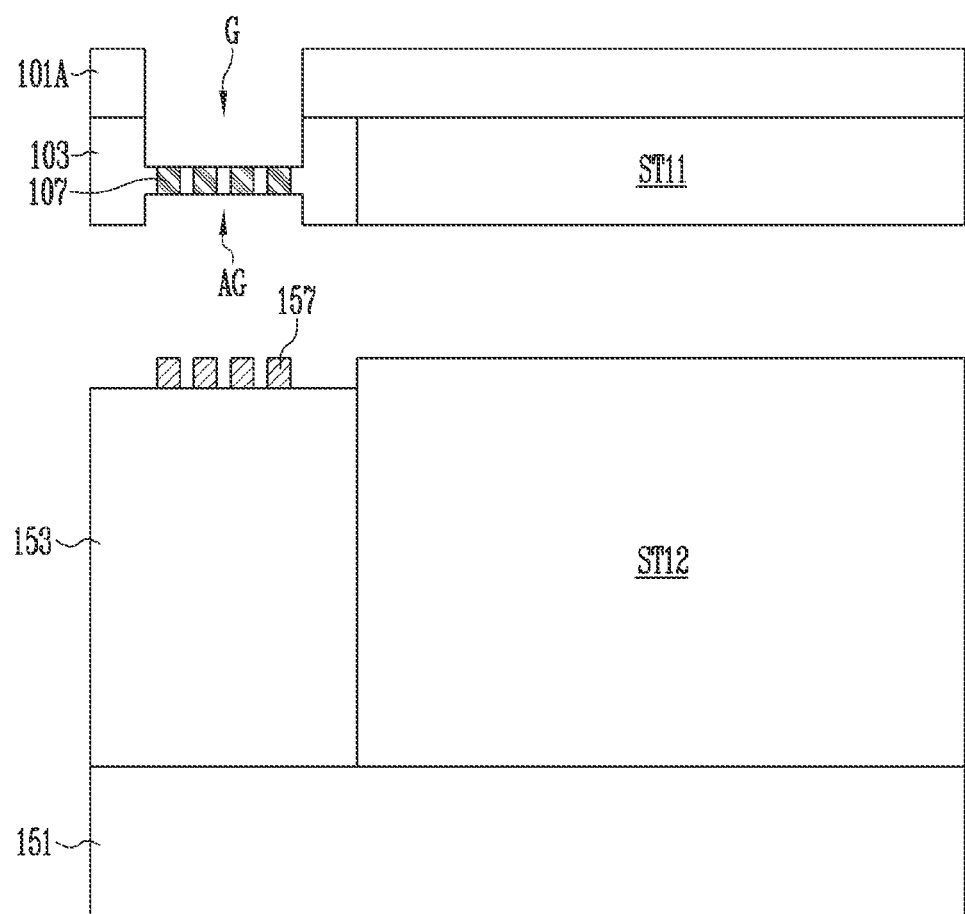

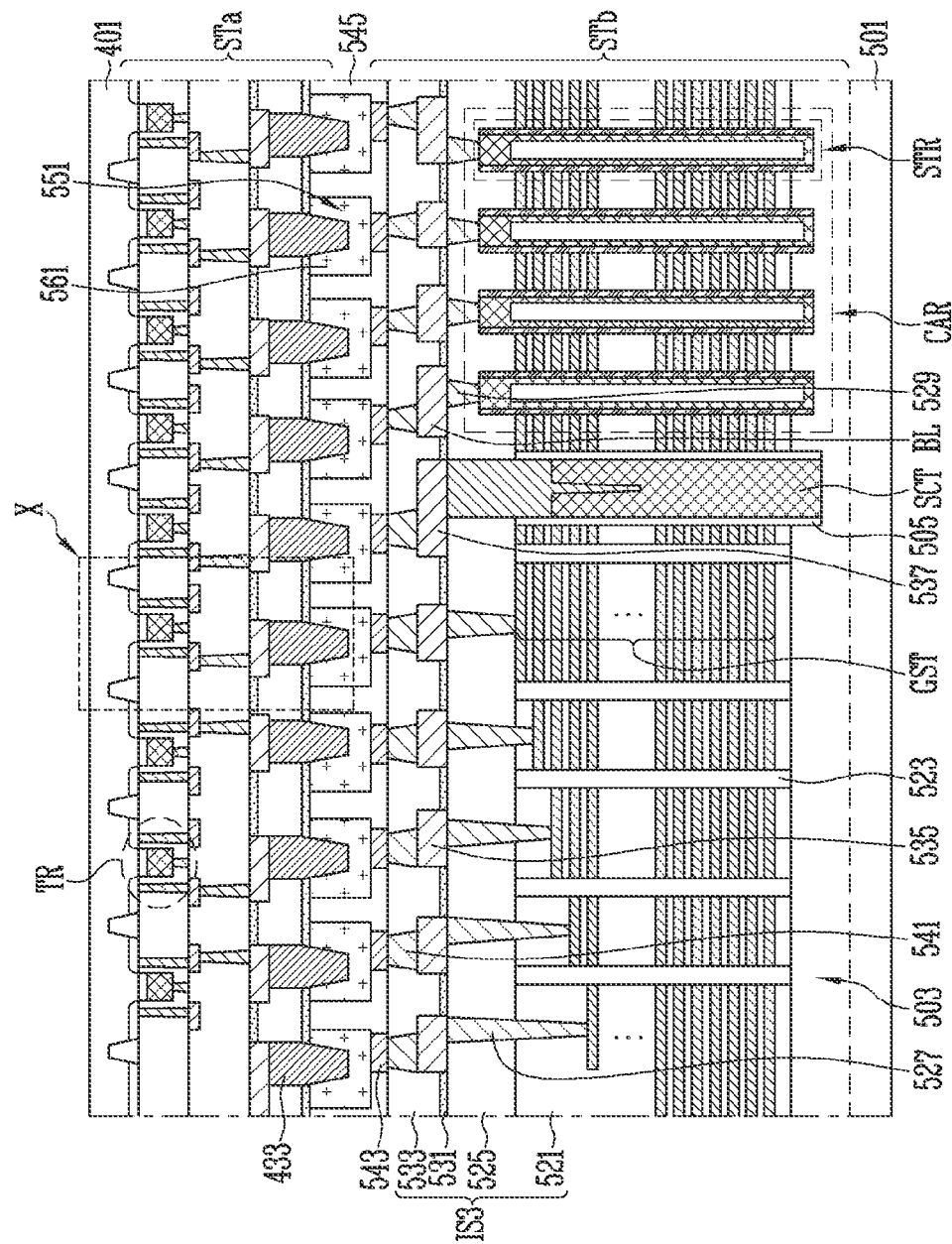

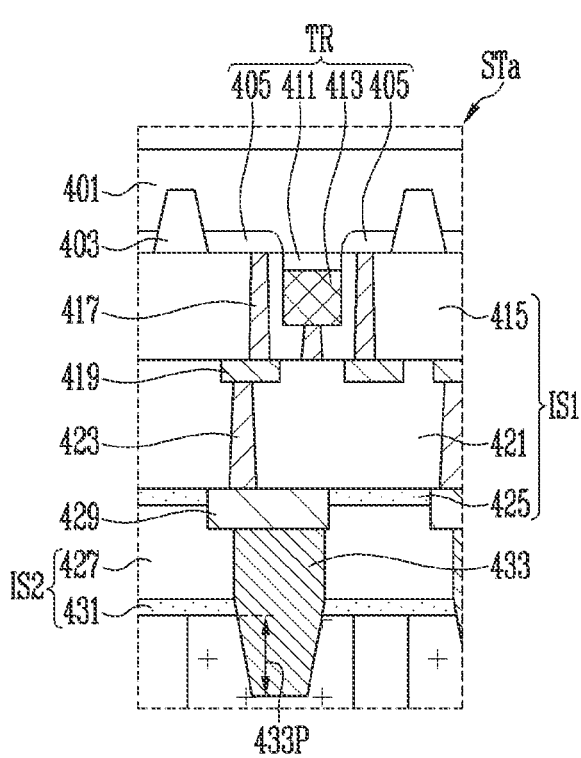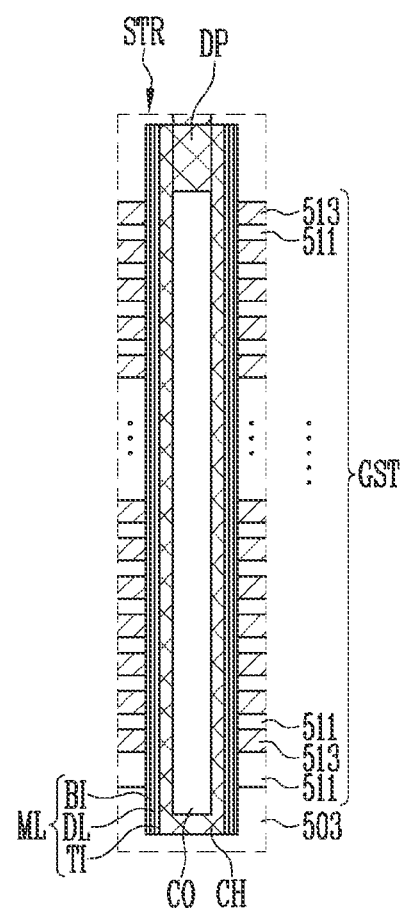

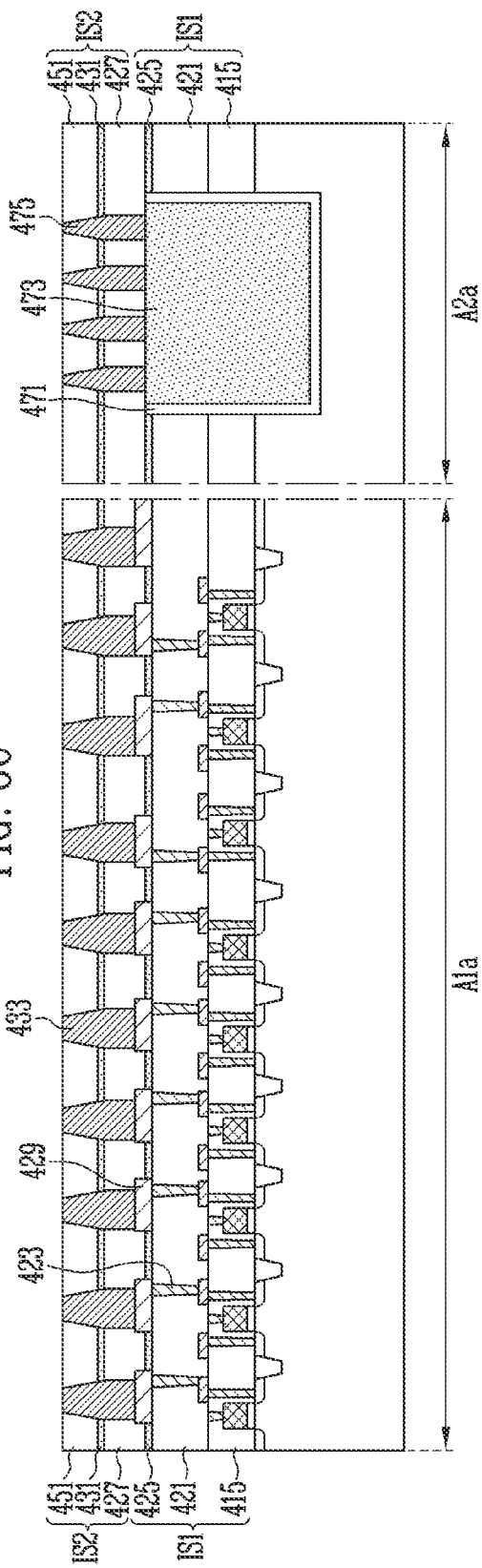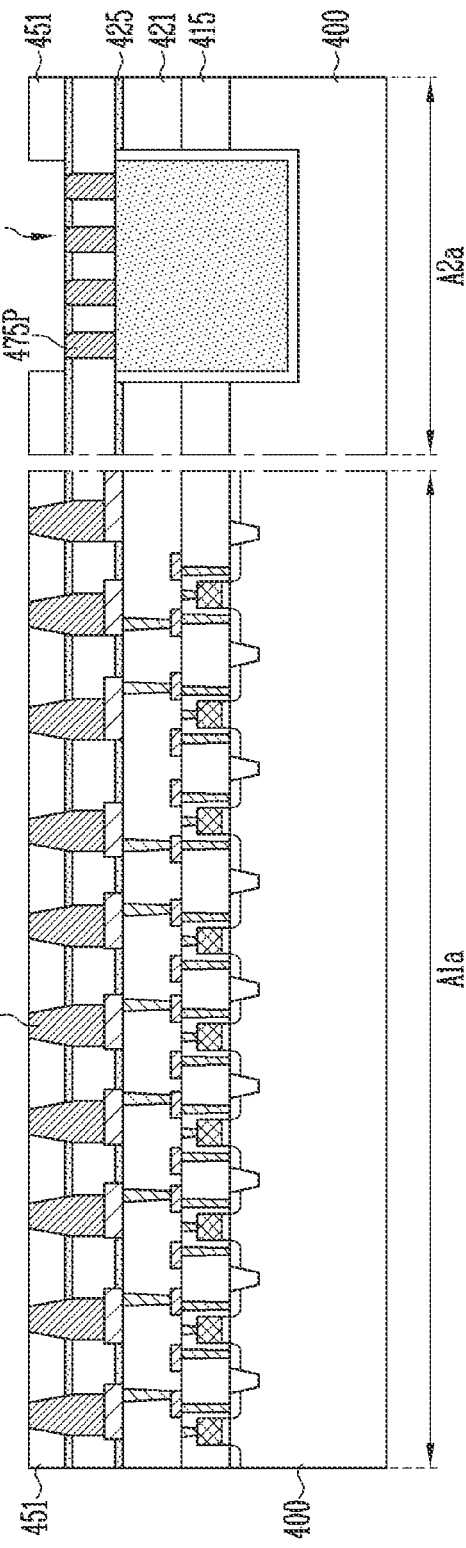

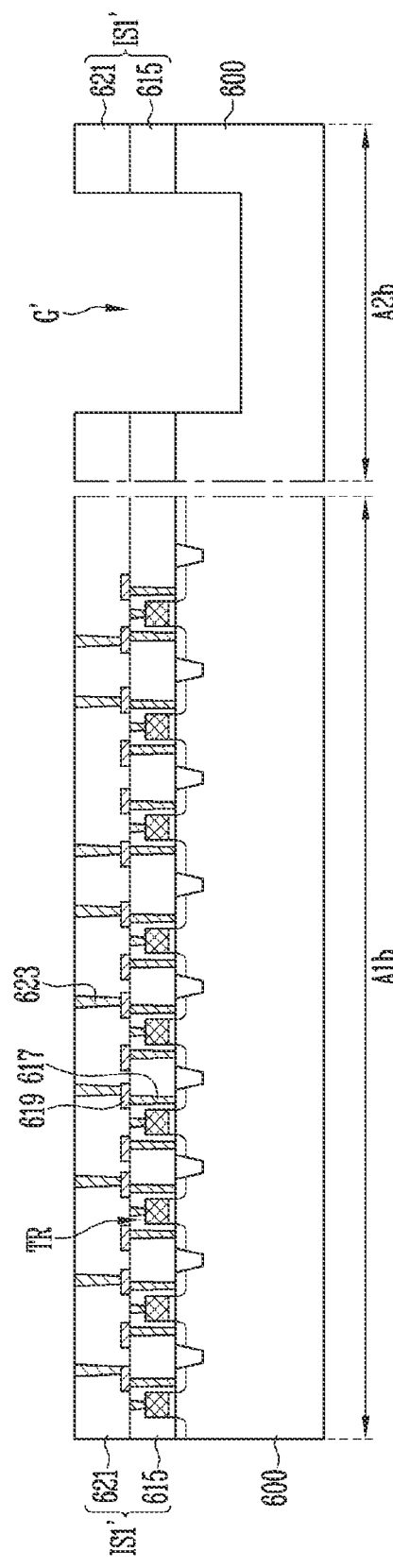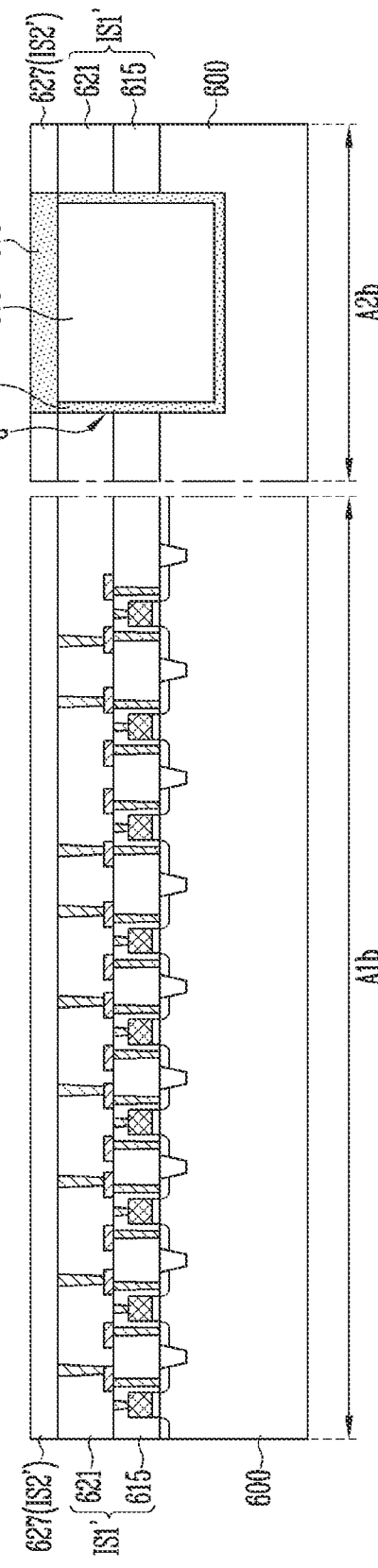

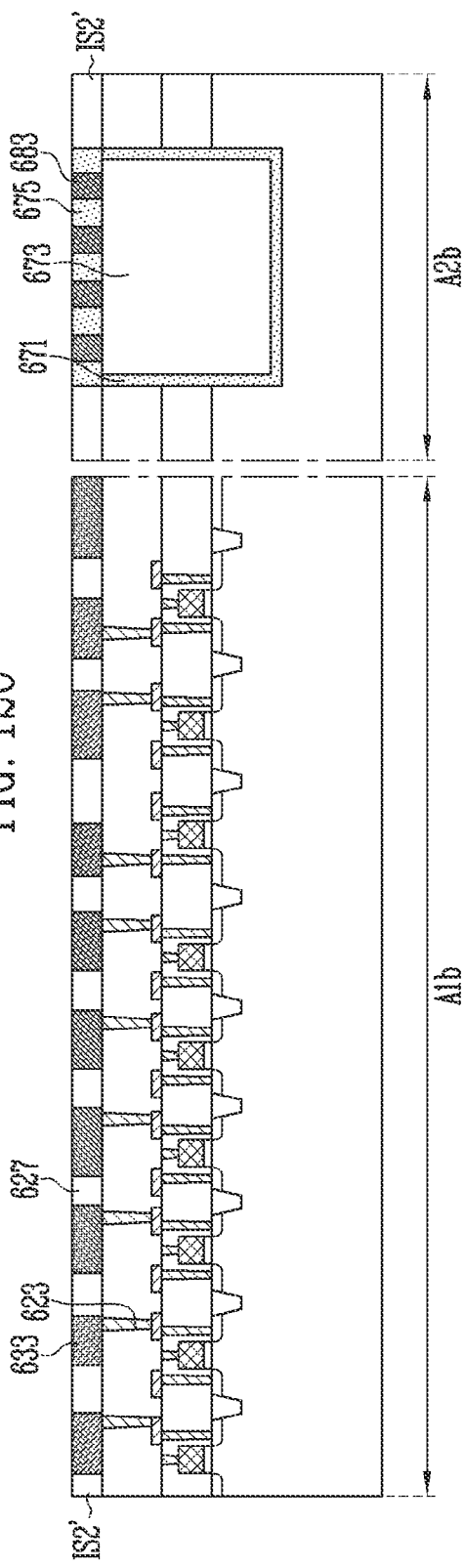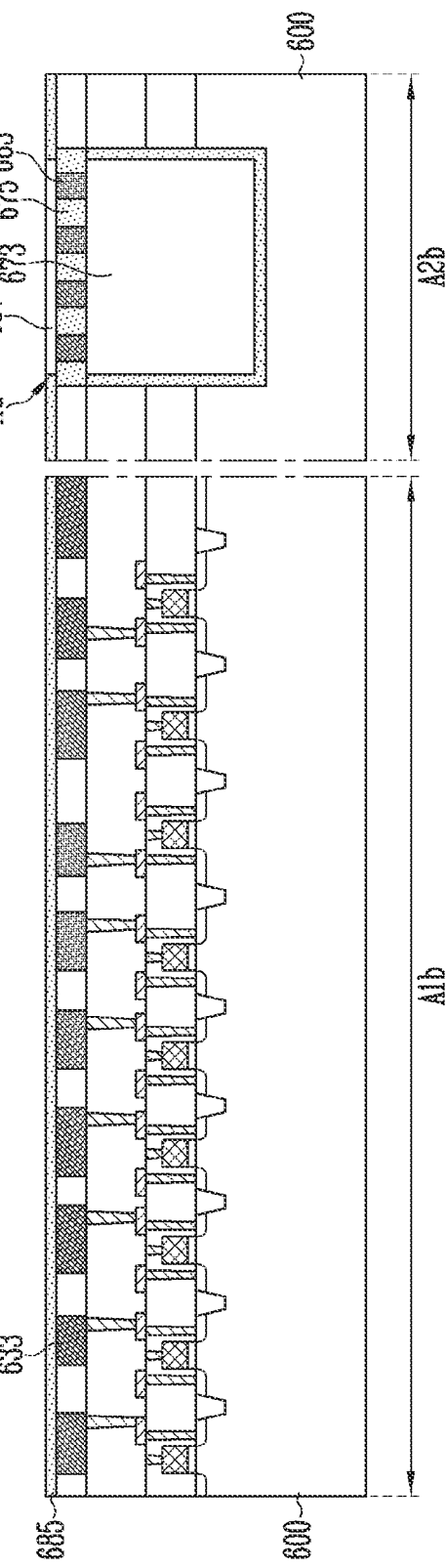

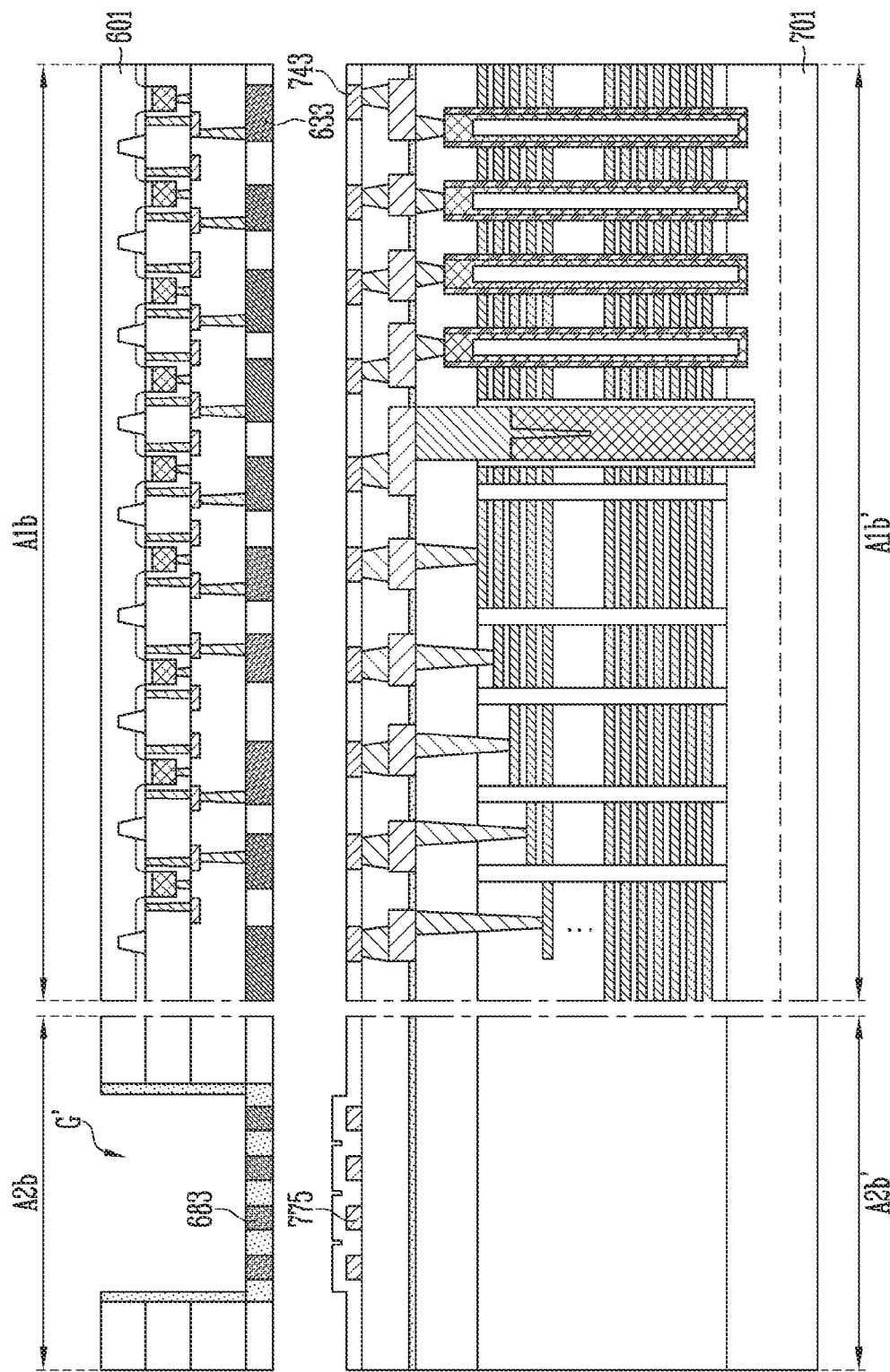

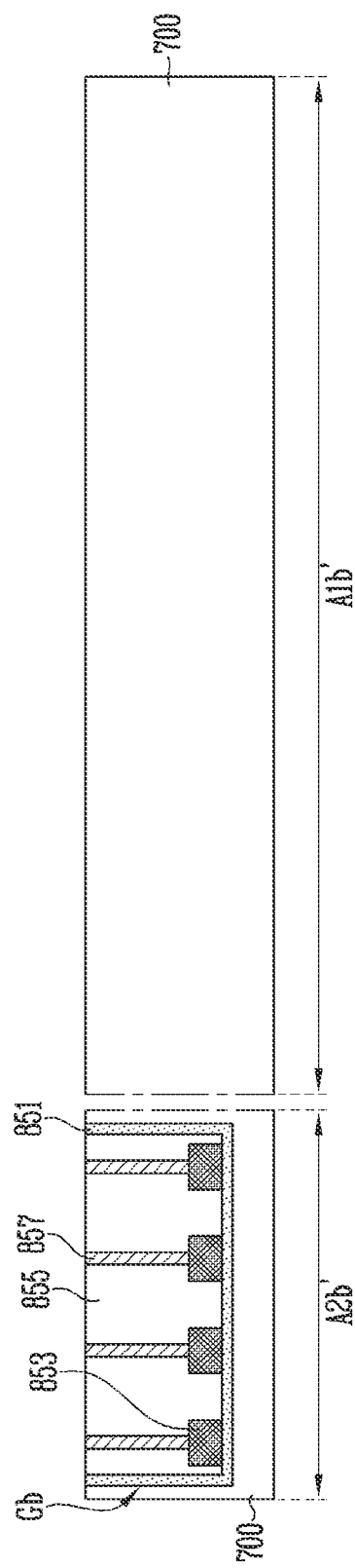

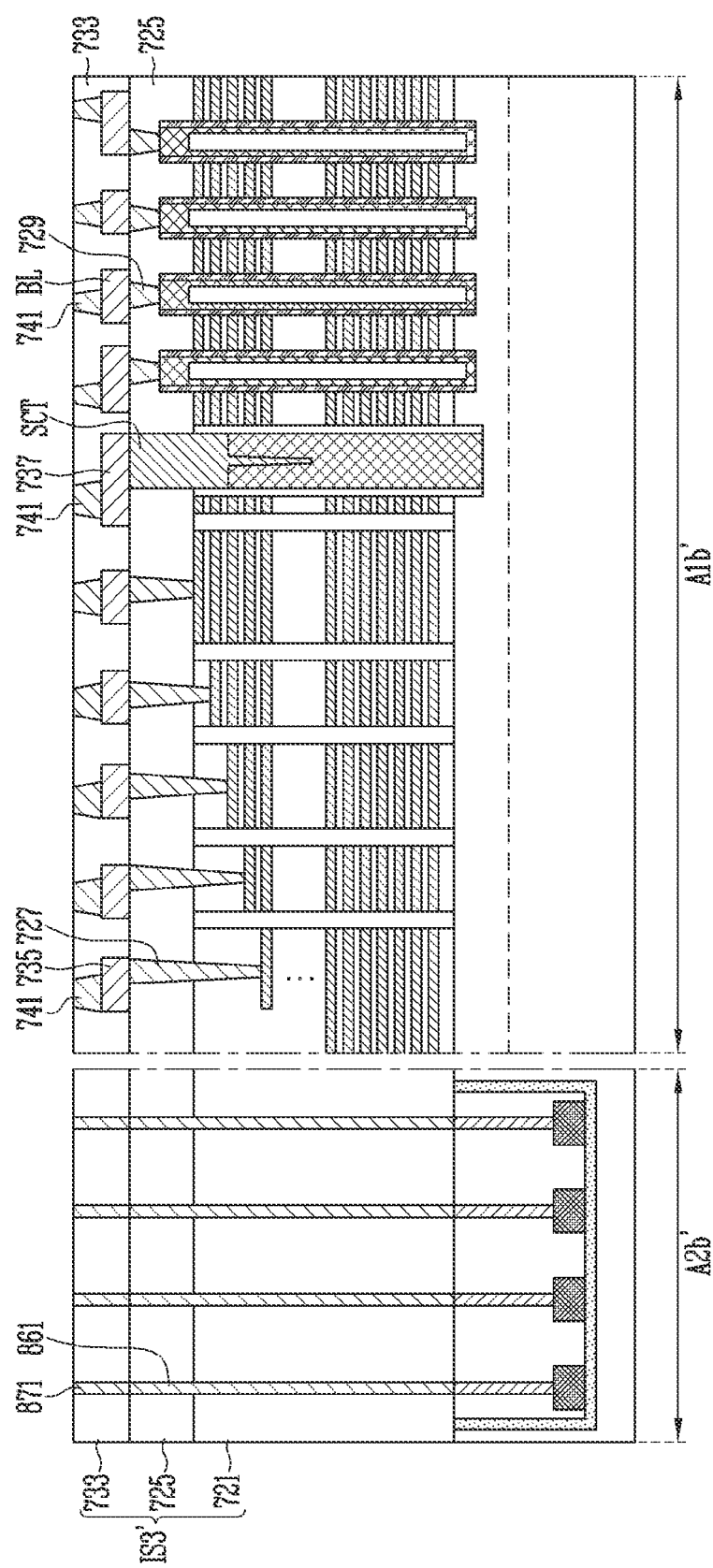

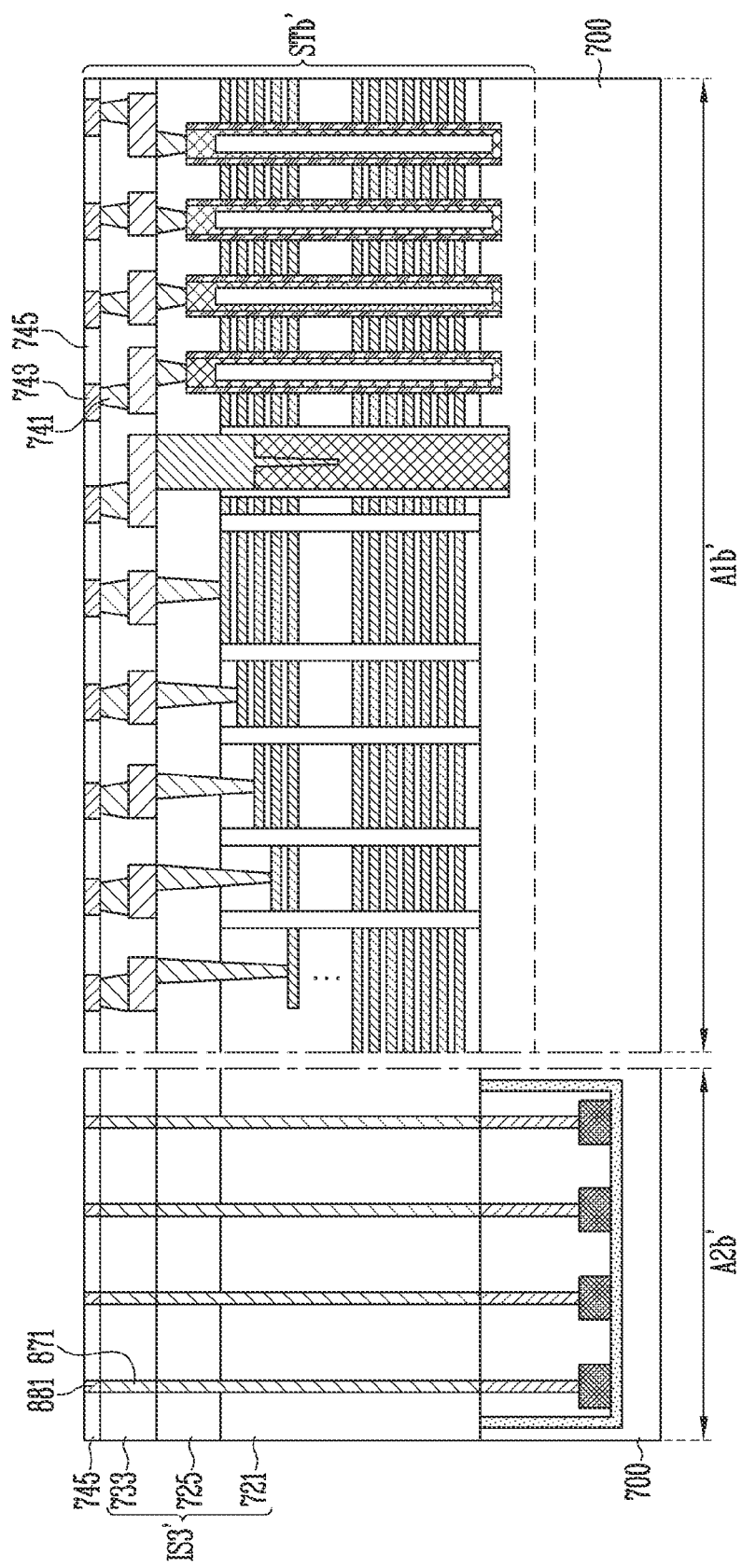

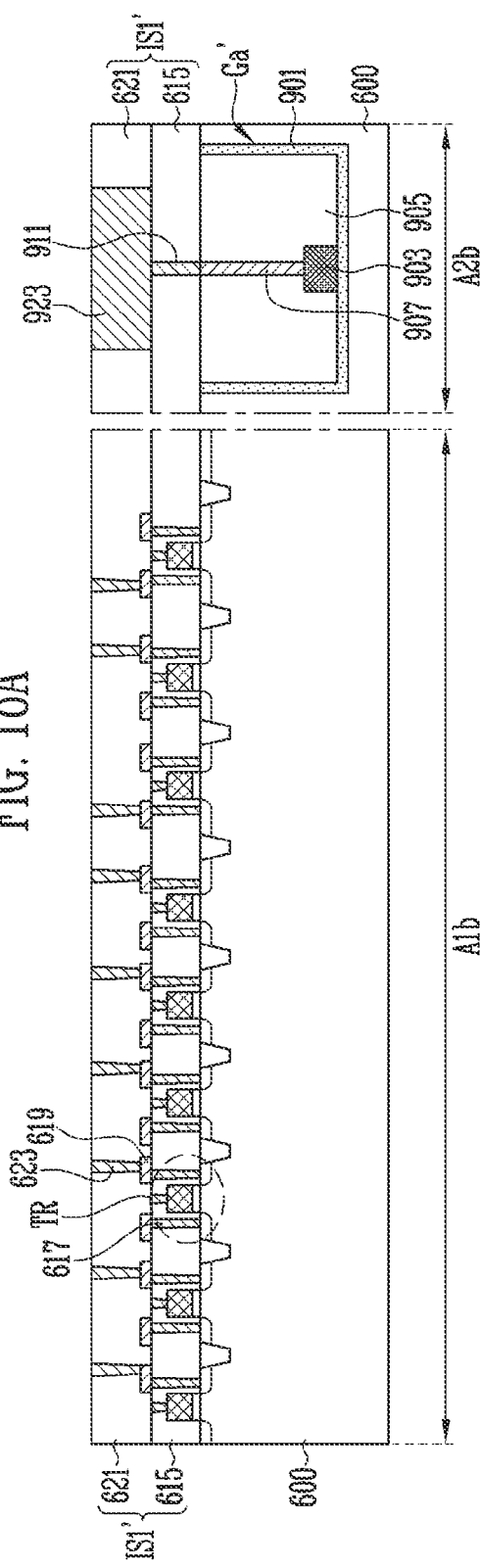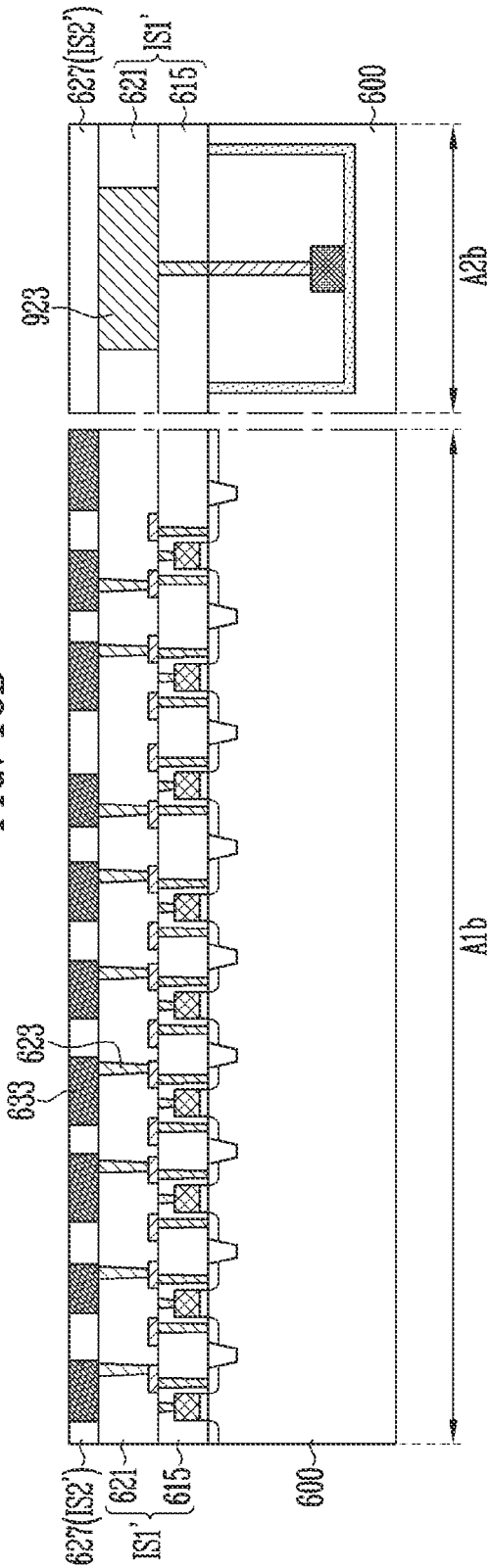

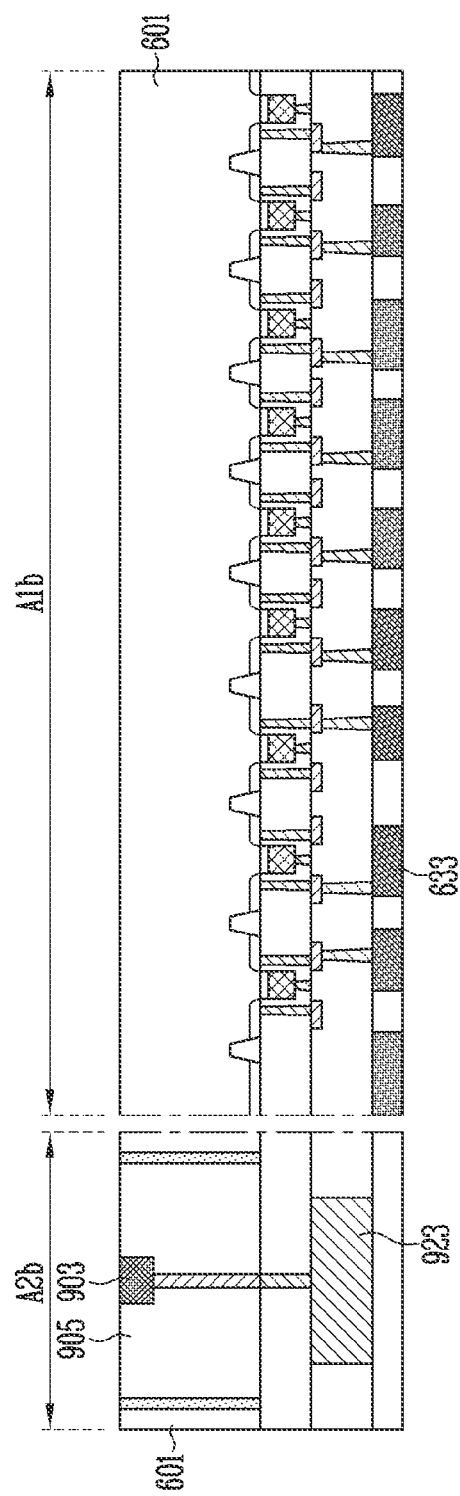

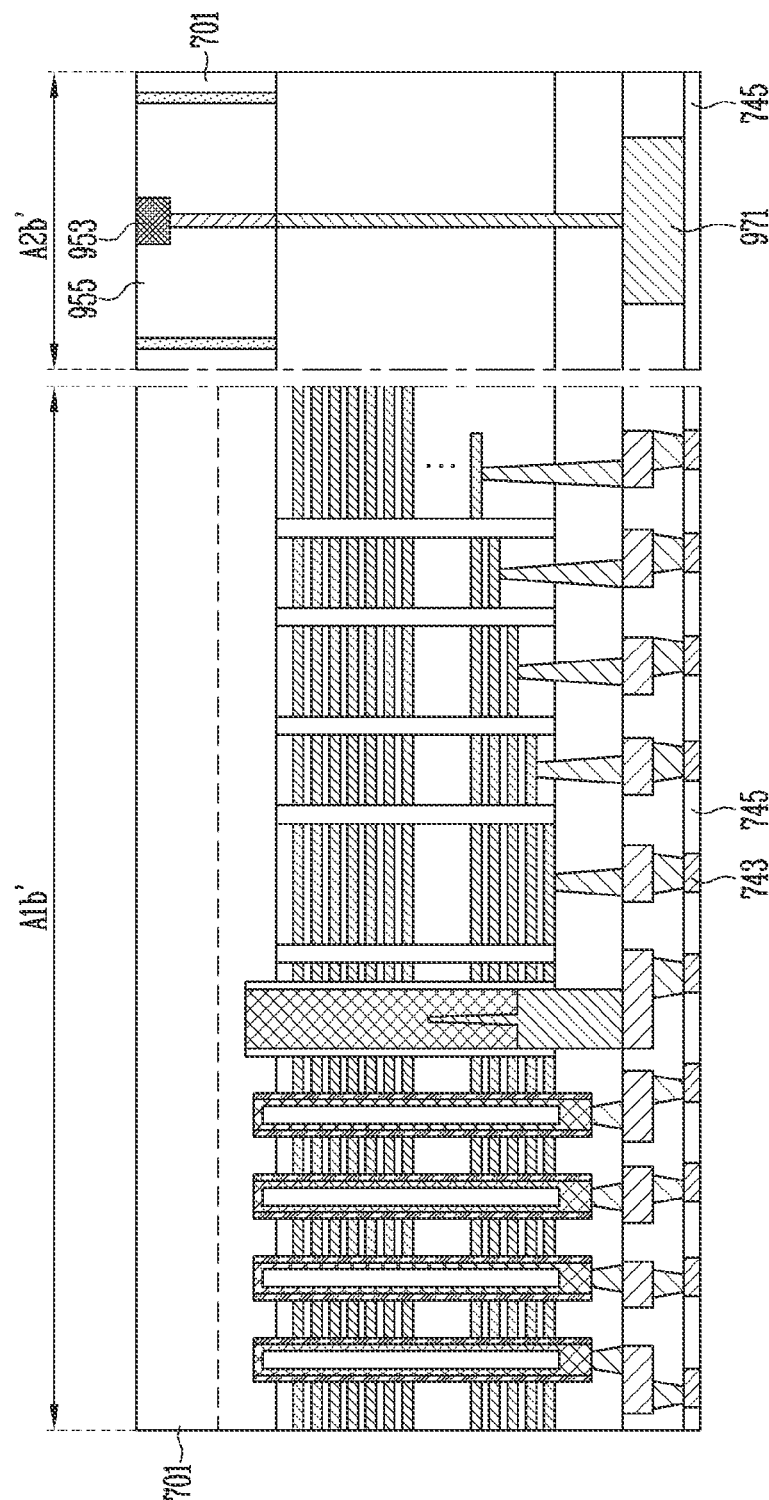

MANUFACTURING METHOD OF A SEMICONDUCTOR MEMORY DEVICE

CROSS-REFERENCE TO RELATED APPLICATION

The present application is a divisional application of U.S. patent application Ser. No. 16/663,119, filed on Oct. 24, 2019, and claims priority under 35 U.S.C. § 119(a) to Korean patent application number 10-2019-0051780, filed on May 2, 2019, in the Korean Intellectual Property Office, the entire disclosure of which is incorporated herein by reference.

BACKGROUND

1. Technical Field

Various embodiments generally relate to a semiconductor memory device, and more particularly, to a method of manufacturing a semiconductor memory device including a memory cell array and a peripheral circuit.

2. Related Art

A semiconductor memory device may include a memory cell array including a plurality of memory cells. A substrate including the memory cell array and a substrate including a peripheral circuit to operate the memory cell array may be separately processed, and then the memory cell array and the peripheral circuit may be coupled.

During the process of coupling the memory cell array and the peripheral circuit, a process failure may occur.

SUMMARY

According to an embodiment, a method of manufacturing a semiconductor memory device may include processing a first substrate and processing a second substrate. Processing of the first substrate may include disposing a peripheral circuit and a first conductive contact pattern coupled to the peripheral circuit over a first region of the first substrate, embedding a sacrificial material in a second region of the first substrate, and disposing a first align mark over the sacrificial material. Processing of the second substrate may include disposing a second align mark, a memory cell array, and a second conductive contact pattern coupled to the memory cell array over the second substrate. The method may also include orientating the first substrate and the second substrate such that the first conductive contact pattern and the second conductive contact pattern face each other, and coupling the first conductive contact pattern to the second conductive contact pattern by checking alignment of the first align mark with the second align mark.

According to an embodiment, a method of manufacturing a semiconductor memory device may include processing a first substrate. Processing the first substrate may include embedding a sacrificial material in the first substrate, disposing a first align mark over the sacrificial material, and disposing a first structure on a first surface of the first substrate. The method may also include exposing the sacrificial material by removing a part of the first substrate from a rear surface of the first substrate opposite the first surface of the first substrate and removing the sacrificial material. The method may further include processing a second substrate. Processing of the second substrate may include disposing a second align mark and a second structure at a surface of the second substrate. The method may additionally include disposing the first substrate over the second substrate such that the second structure and the first structure face each other, and coupling the first structure and the second structure by checking alignment of the first align mark with the second align mark through a region from which the sacrificial material was removed.

According to an embodiment, a method of manufacturing a semiconductor memory device may include forming a first align mark and a peripheral circuit over a first substrate, forming a second align mark and a memory cell array over a second substrate, orientating the first substrate and the second substrate such that the peripheral circuit and the memory cell array face each other, and aligning and coupling the peripheral circuit with the memory cell array. Aligning the peripheral circuit with the memory cell array includes measuring capacitance between the first align mark and the second align mark.

BRIEF DESCRIPTION OF THE DRAWINGS

FIGS. 1A, 1B, 2A, 2B, and 3 are cross-sectional diagrams illustrating a method of manufacturing a semiconductor memory device according to an embodiment;

FIGS. 7A to 7C are cross-sectional diagrams illustrating a semiconductor memory device according to an embodiment;

FIGS. 8A to 8G, 9, and 10 are cross-sectional diagrams illustrating a method of manufacturing a semiconductor memory device according to an embodiment;

FIGS. 12A to 12G, 13, and 14 are cross-sectional diagrams illustrating a method of manufacturing a semiconductor memory device according to an embodiment;

FIGS. 18A to 18C, 19A to 19C, and 20 are cross-sectional diagrams illustrating a method of manufacturing a semiconductor memory device according to an embodiment;

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and should not be construed as being limited to the embodiments set forth herein.

Various embodiments are directed to a manufacturing method of a semiconductor memory device capable of improving the process stability.

FIGS. 1A, 1B, 2A, 2B, and 3 are cross-sectional diagrams illustrating a method of manufacturing a semiconductor memory device according to an embodiment.

Figure 1A:
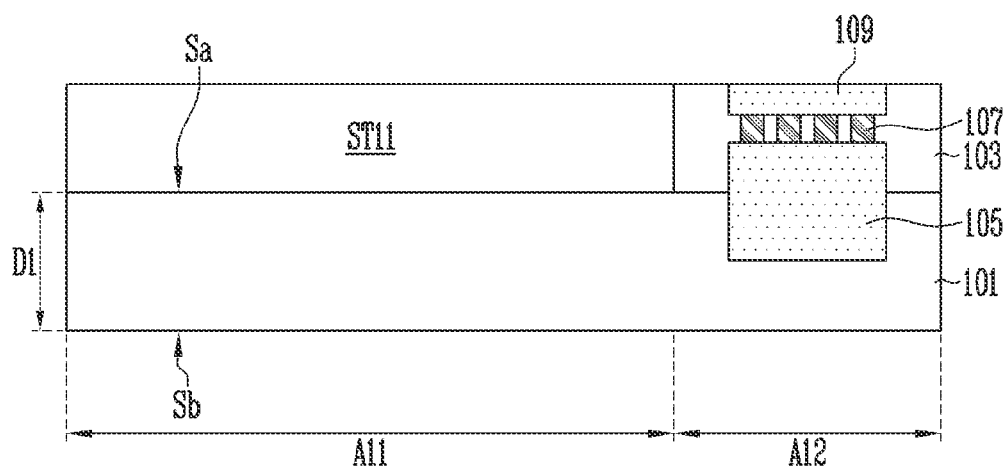

FIG. 1A illustrates processing a first substrate 101.

Referring to FIG. 1A, the first substrate 101 may be a single crystal semiconductor layer. For example, the first substrate 101 may be a bulk silicon substrate, a silicon-on-insulator substrate, a germanium substrate, a germanium-on-insulator substrate, a silicon-germanium substrate, or an epitaxial film formed by a selective epitaxial growth method.

The first substrate 101 may include a first region A11 and a second region A12. The first substrate 101 may be processed such that a first structure ST11 may be disposed on a surface Sa of the first substrate 101, a sacrificial material 105 may be embedded in the first substrate 101, and a first align mark 107 may be disposed on the sacrificial material 105.

The first structure ST11 may include a memory cell array or a peripheral circuit. The memory cell array may include memory cells arranged in three dimensions or memory cells arranged in two dimensions. The first structure ST11 may be formed over the first region A11 of the first substrate 101.

The sacrificial material 105 may be embedded in the second region A12 of the first substrate 101. The sacrificial material 105 may protrude farther than the surface Sa of the first substrate 101 and may be covered by an insulating structure 103. The insulating structure 103 may include one or more insulating layers. The sacrificial material 105 may include a different material from the insulating structure 103. For example, the sacrificial material 105 may include a material having a different etch rate from the insulating structure 103. According to an embodiment, the insulating structure 103 may include an oxide layer, and the sacrificial material 105 may include a nitride layer.

The first align mark 107 may be simultaneously formed with a part of elements that constitute the first structure ST11 when the first structure ST11 is formed. The first align mark 107 may include a conductive material. The first align mark 107 may be embedded in the insulating structure 103 and covered by a protective layer 109.

The protective layer 109 may include a material that prevents the first align mark 107 from being oxidized. For example, the protective layer 109 may include a nitride layer.

The first substrate 101 may include a rear surface Sb facing opposite direction to the surface Sa. A first thickness D1 may be defined between the rear surface Sb and the surface Sa of the first substrate 101.

Figure 1B:
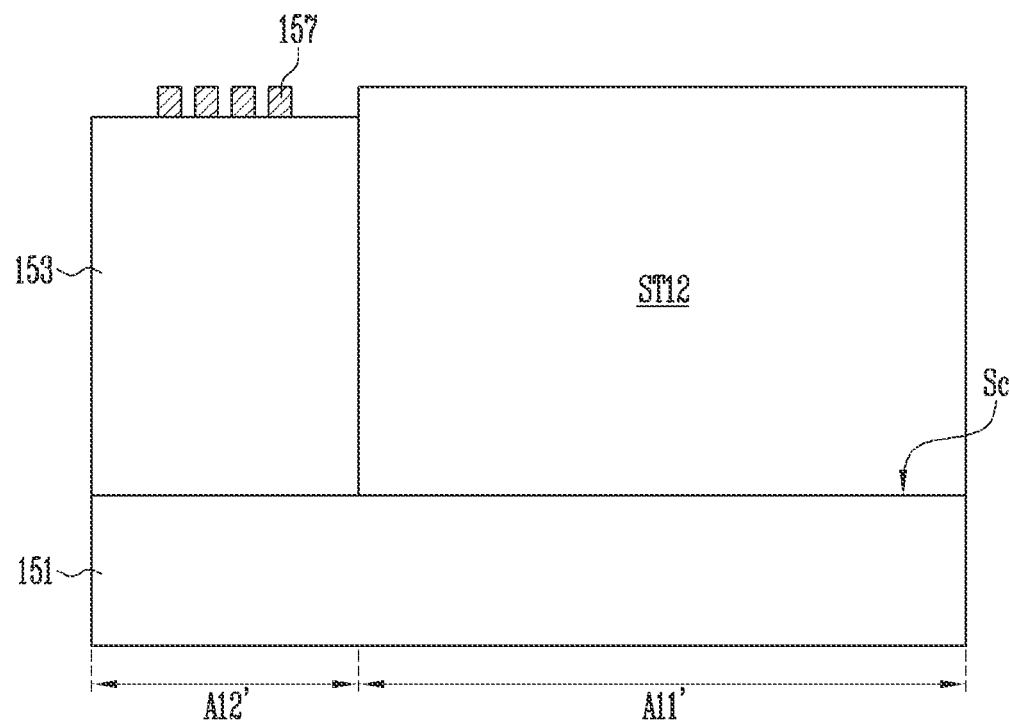

FIG. 1B illustrates processing a second substrate 151.

Referring to FIG. 1B, the second substrate 151 may be a single crystal semiconductor layer. For example, the second substrate 151 may be a bulk silicon substrate, a silicon-on-insulator substrate, a germanium substrate, a germanium-on-insulator substrate, a silicon-germanium substrate, or an epitaxial film formed by a selective epitaxial growth method.

The second substrate 151 may include a first region A11' and a second region A12'. The second substrate 151 may be processed such that a second structure ST12 and an insulating structure 153 are disposed on a surface Sc of the second substrate 151 and a step may be defined between a second align mark 157 and the insulating structure 153. The insulating structure 153 may include one or more insulating layers.

The second structure ST12 may include a memory cell array or a peripheral circuit. For example, when the first structure ST11 shown in FIG. 1A includes a peripheral circuit, the second structure ST12 may include a memory cell array. In another example, when the first structure ST11 shown in FIG. 1A includes a memory cell array, the second structure ST12 may include a peripheral circuit. The second structure ST12 may be formed over the first region A11' of the second substrate 151.

The insulating structure 153 may cover the second region A12' of the second substrate 151.

The second align mark 157 may be simultaneously formed with a part of elements that constitute the second structure ST12 when the second structure ST12 is formed. The second align mark 157 may include patterns protruding farther than a surface of the insulating structure 153 and may be spaced apart from each other to define a step between the second align mark 157 and the insulating structure 153. The patterns included in the second align mark 157 may include a conductor or a nonconductor. The second align mark 157 may be distinguished by the step.

Figure 2A:
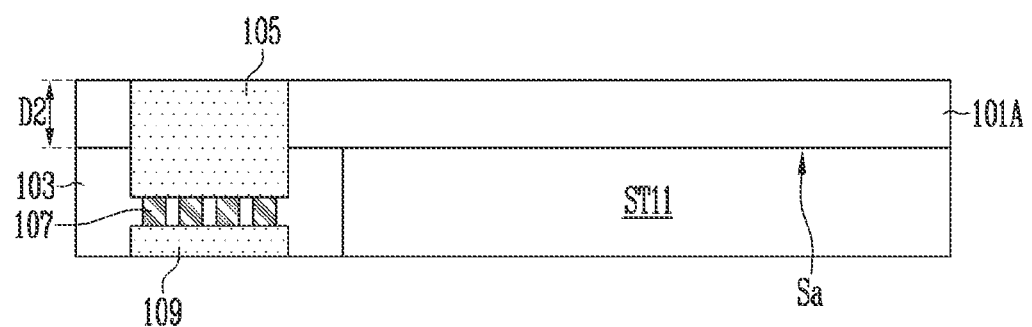
Figure 2B:
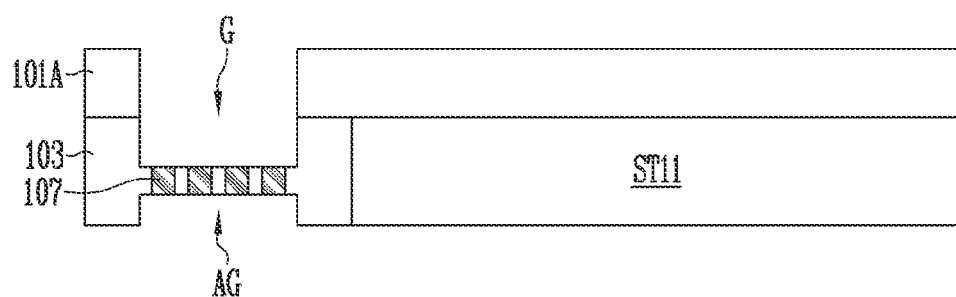

FIGS. 2A and 2B illustrate exposing the first align mark 107.

Referring to FIG. 2A, the first substrate 101 may be partially removed from the rear surface Sb of the first substrate 101 described with reference to FIG. 1A to expose the sacrificial material 105. Accordingly, a first substrate 101A having a second thickness D2 smaller than the first thickness D1 shown in FIG. 1A may be formed. The first substrate 101 may be ground from the rear surface Sb of the first substrate 101 described with reference to FIG. 1A to form the first substrate 101A having the second thickness D2. Because the first substrate 101A is not completely removed but remains to have the second thickness D2, a crack due to stress which is caused during a subsequent process to couple a memory cell array and a peripheral circuit may be prevented.

Subsequently, the exposed sacrificial material 105 may be selectively removed. When the sacrificial material 105 includes a nitride layer, phosphoric acid may be used to selectively remove the sacrificial material 105. A groove G exposing the first align mark 107 may be defined by removing the sacrificial material 105 as shown in FIG. 2B.

Referring to FIG. 2B, an auxiliary groove AG may be defined by removing the protective layer 109 shown in FIG. 2A when the sacrificial material 105 shown in FIG. 2A is removed to form the groove G. The groove G and the auxiliary groove AG may expose the first align mark 107 from opposite directions.

FIG. 3 illustrates aligning the first substrate 101A and the second substrate 151 to couple the first structure ST11 and the second structure ST12.

Referring to FIG. 3, the first substrate 101A having the second thickness may be aligned over the second substrate 151 such that the first structure ST11 faces the second structure ST12. The arrangement of the first substrate 101A having the second thickness and the second substrate 151 in the vertical direction may be reversed.

A degree of alignment may be checked by detecting alignment of the first align mark 107 and the second align mark 157 to correctly align the first structure ST11 and the second structure ST12. When the first align mark 107 and the second align mark 157 are correctly aligned, the first structure ST11 and the second structure ST12 may be coupled to each other.

The alignment of the first align mark 107 and the second align mark 157 may be detected through the groove G. According to an embodiment, the first align mark 107 and the second align mark 157 may be detected through the groove G without interruption of the first substrate 101A. According to this embodiment, the accuracy of a detection signal regarding the first align mark 107 and the second align mark 157 may be improved.

Figure 4:
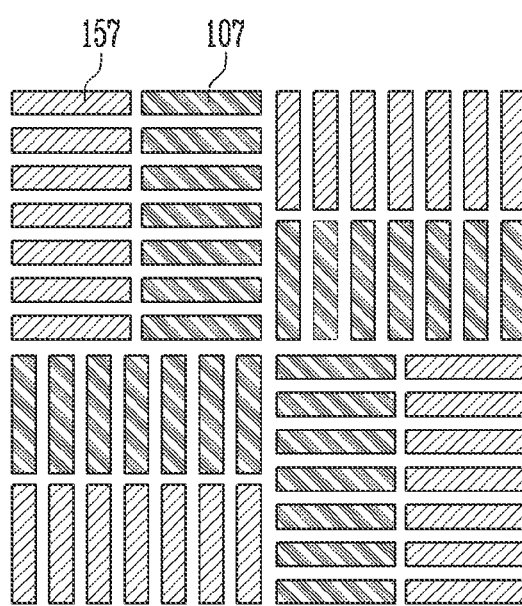
FIG. 4 is a plan view illustrating alignment of a first align mark and a second align mark according to an embodiment.

FIG. 4 is a plan view illustrating alignment of the first align mark 107 and the second align mark 157 according to an embodiment.

Referring to FIG. 4, the first structure ST11 and the second structure ST12 shown in FIG. 3 may be coupled when the first align mark 107 and the second align mark 157 are aligned to form a predetermined pattern as shown in FIG. 4 or to be within a margin of error. The first align mark 107 and the second align mark 157 are not limited to the shape shown in FIG. 4, but may be variously changed.

Figure 5A:
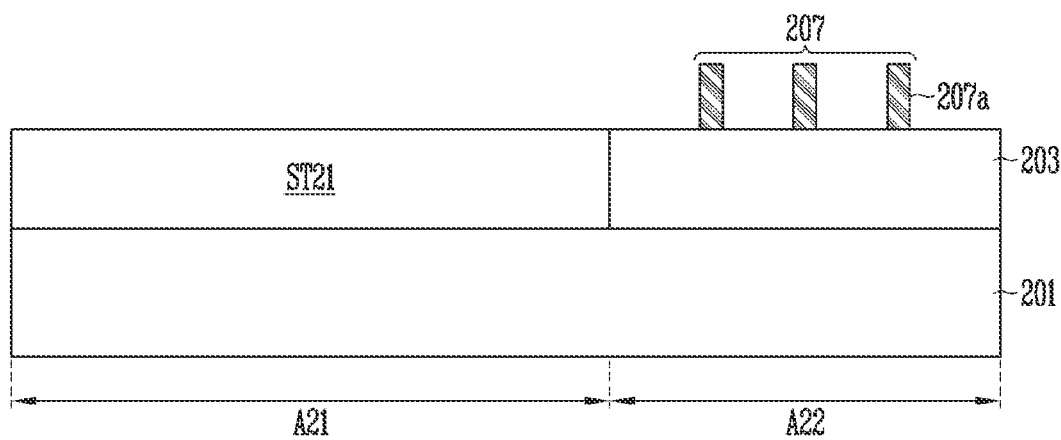
FIGS. 5A to 5C are cross-sectional diagrams illustrating a method of manufacturing a semiconductor memory device according to an embodiment.
Figure 5B:
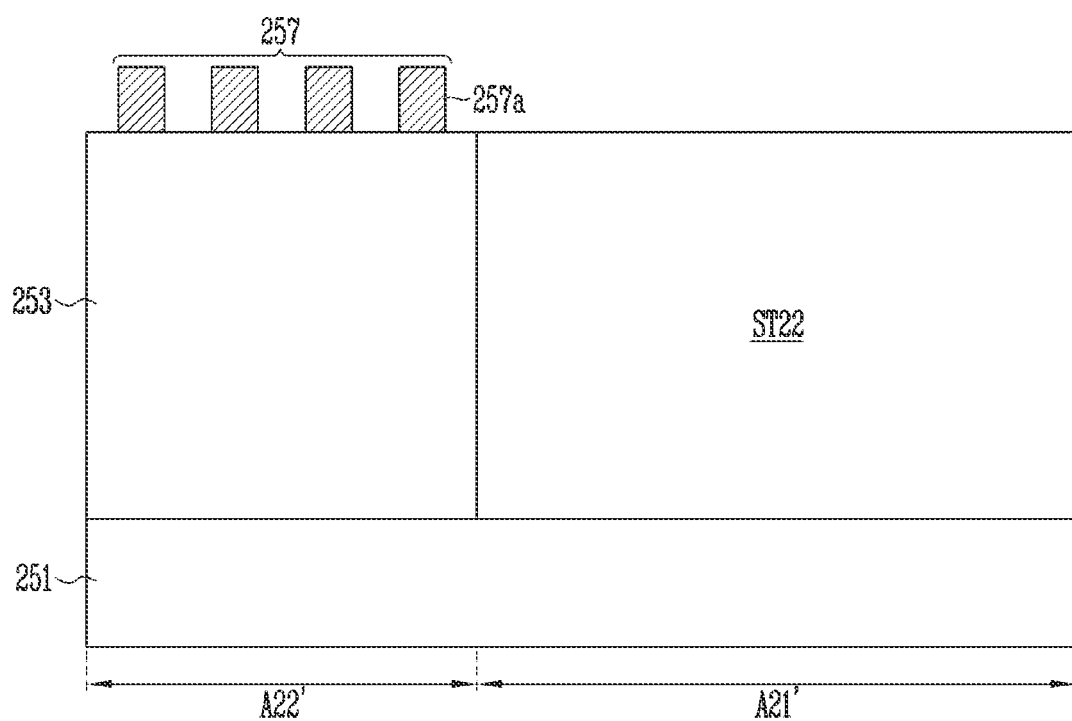
Figure 5C:
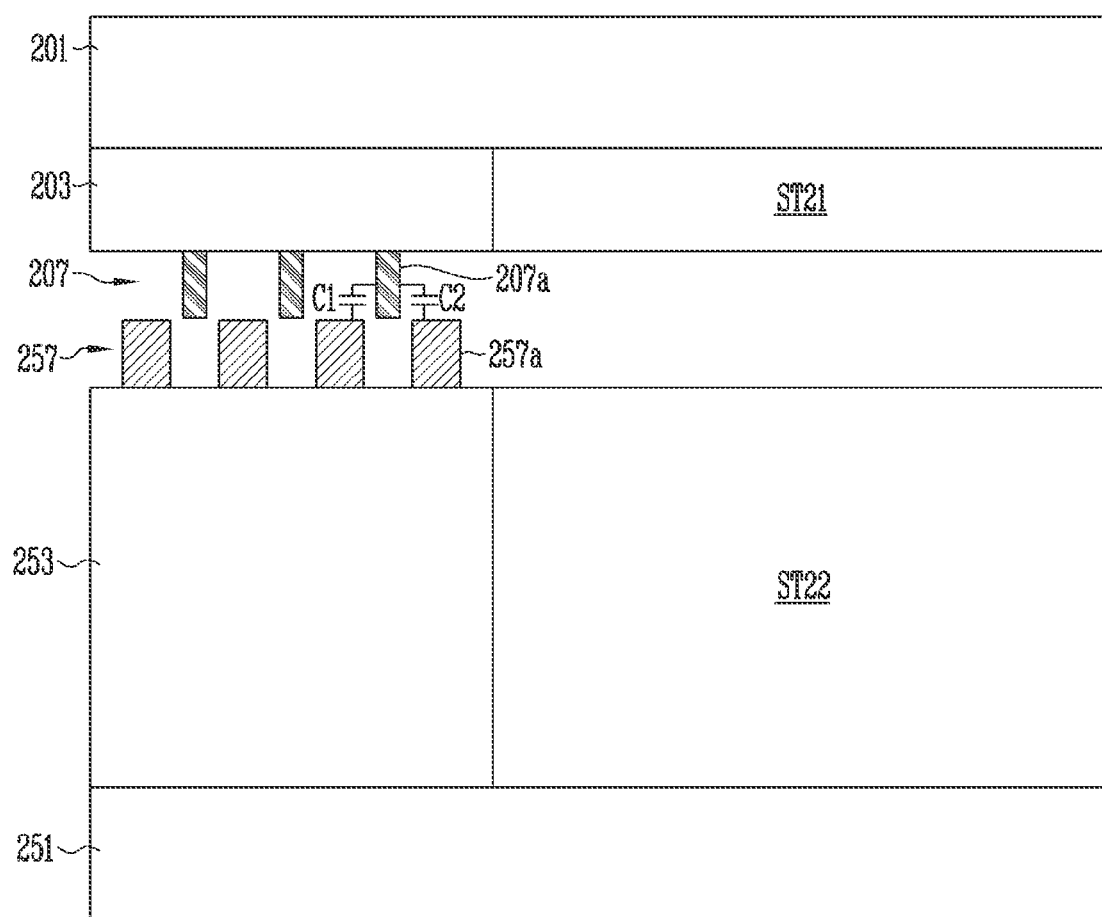

FIGS. 5A to 5C are cross-sectional diagrams illustrating a method of manufacturing a semiconductor memory device according to an embodiment.

Referring to FIG. 5A, a first structure ST21 and a first align mark 207 may be formed on a first substrate 201. The first substrate 201 may include the same material as the first substrate 101 described above with reference to FIG. 1A. The first substrate 201 may include a first region A21 and a second region A22.

The first structure ST21 may include a memory cell array or a peripheral circuit and may be formed over the first region A21 of the first substrate 201 as described above with reference to FIG. 1A. The second region A22 of the first substrate 201 may be covered by an insulating structure 203. The insulating structure 203 may include a single insulating layer or multilayer insulting layers. The first align mark 207 may include first capacitor electrodes 207a spaced apart from each other.

Although not illustrated in FIG. 5A, a contact pad and a contact plug may be electrically coupled to each of the first capacitor electrodes 207a to apply an electrical signal to the first capacitor electrodes 207a from a rear surface side of the first substrate 201. The contact pad may be embedded in the first substrate 201 and the contact plug may pass through the insulating structure 203 to be coupled to the contact pad and the corresponding first capacitor electrode. Embodiments of structures of the contact pad and the contact plug are described below with reference to FIGS. 15D and 16E.

Referring to FIG. 5B, a second structure ST22 and a second align mark 257 may be formed on a second substrate 251. The second substrate 251 may include the same material as the second substrate 151 described above with reference to FIG. 1B. The second substrate 251 may include a first region A21' and a second region A22'.

The second structure ST22 may include a memory cell array or a peripheral circuit and may be formed over the first region A21' of the second substrate 251 as described above with reference to FIG. 1B. The second region A22' of the second substrate 251 may be covered by an insulating structure 253. The insulating structure 253 may include a single insulating layer or multilayer insulting layers. The second align mark 257 may include second capacitor electrodes 257a spaced apart from each other.

Although not illustrated in FIG. 5B, a contact pad and a contact plug may be electrically coupled to each of the second capacitor electrodes 257a to apply an electrical signal to the second capacitor electrodes 257a from a rear surface side of the second substrate 251. The contact pad may be embedded in the second substrate 251 and the contact plug may pass through the insulating structure 253 to be coupled to the contact pad and the corresponding second capacitor electrode. Embodiments of structures of the contact pad and the contact plug are described below with reference to FIGS. 15D and 16E.

Referring to FIG. 5C, the first substrate 201 and the second substrate 251 may be aligned such that the first structure ST21 faces the second structure ST22.

Capacitance C1 and C2 between the first align mark 207 and the second align mark 257 may be measured to correctly align the first structure ST21 and the second structure ST22. For example, the first capacitor electrodes 207a of the first align mark 207 and the second capacitor electrodes 257a of the second align mark 257 may be alternately arranged in a horizontal direction. First capacitance C1 and second capacitance C2 between one of the first capacitor electrodes 207a and the second capacitor electrodes 257a adjacent thereto may be measured. When the first capacitance C1 and the second capacitance C2 are measured and have values within margin of error, the first structure ST21 and the second structure ST22 may be coupled to each other.

Figure 6A:
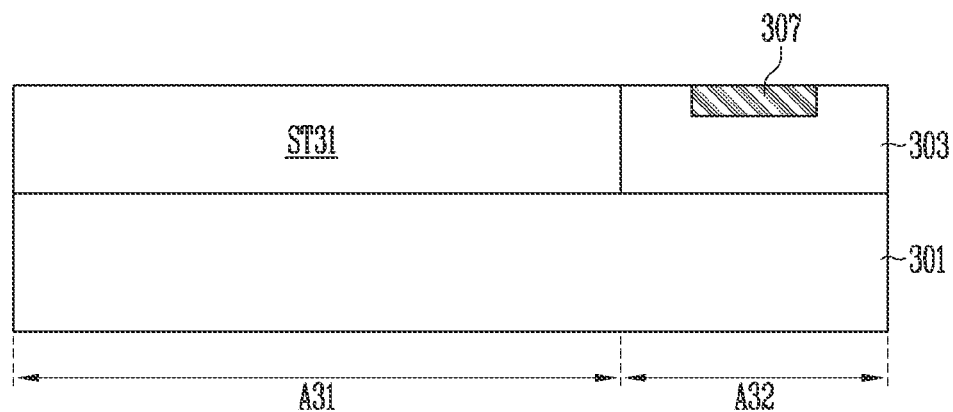
FIGS. 6A to 6C are cross-sectional diagrams illustrating a method of manufacturing a semiconductor memory device according to an embodiment.
Figure 6B:
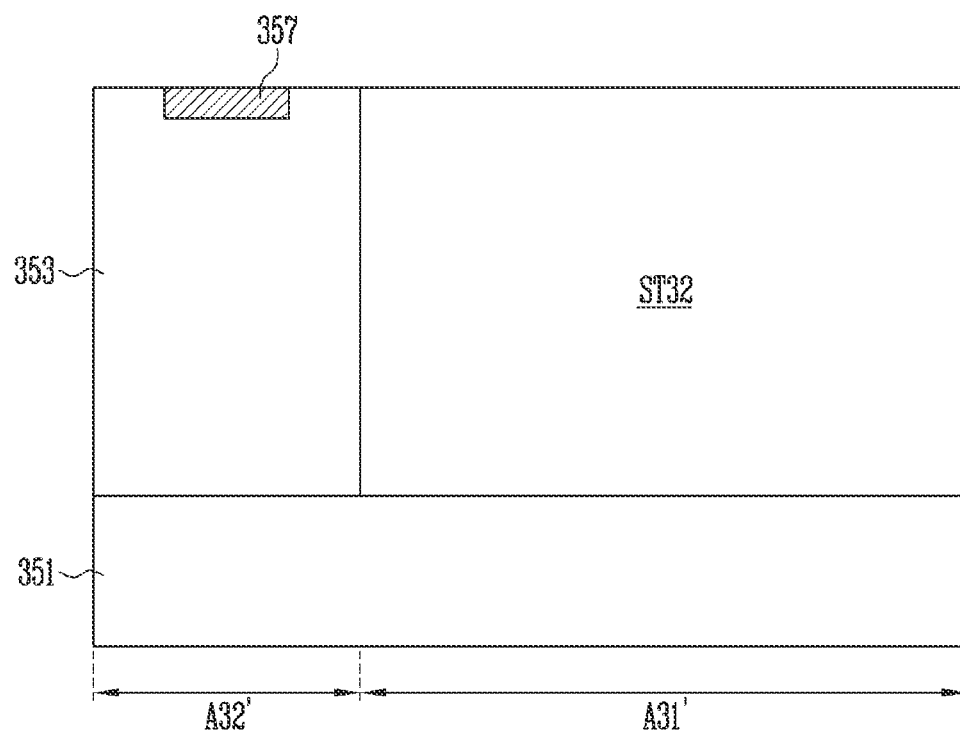
Figure 6C:
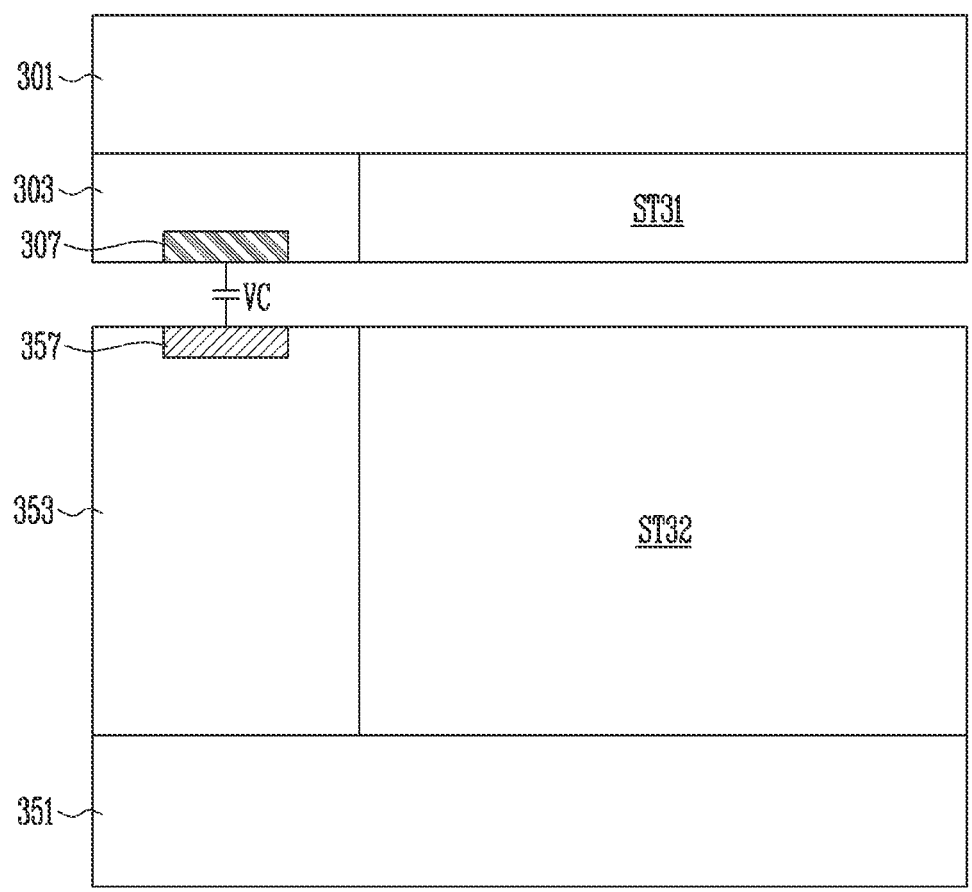

FIGS. 6A to 6C are cross-sectional diagrams illustrating a method of manufacturing a semiconductor memory device according to an embodiment.

Referring to FIG. 6A, a first structure ST31 and a first align mark 307 may be formed on a first substrate 301. The first substrate 301 may include the same material as the first substrate 101 described above with reference to FIG. 1A. The first substrate 301 may include a first region A31 and a second region A32.

The first structure ST31 may include a memory cell array or a peripheral circuit and may be formed over the first region A31 of the first substrate 301 as described above with reference to FIG. 1A. The second region A32 of the first substrate 301 may be covered by an insulating structure 303. The insulating structure 303 may include a single insulating layer or multilayer insulting layers. The first align mark 307 may be formed in the insulating structure 303. The first align mark 307 may include a conductive material.

Although not illustrated in FIG. 6A, a contact pad and a contact plug may be electrically coupled to the first align mark 307 to apply an electrical signal to the first align mark 307 from a rear surface side of the first substrate 301. The contact pad may be embedded in the first substrate 301 and the contact plug may pass through the insulating structure 303 to be coupled to the contact pad and to be coupled to the first align mark 307. Embodiments of structures of the contact pad and the contact plug are described below with reference to FIGS. 18C and 19C.

Referring to FIG. 6B, a second structure ST32 and a second align mark 357 may be formed on a second substrate 351. The second substrate 351 may include the same material as the second substrate 151 described above with reference to FIG. 1B. The second substrate 351 may include a first region A31' and a second region A32'.

The second structure ST32 may include a memory cell array or a peripheral circuit and may be formed over the first region A31' of the second substrate 351 as described above with reference to FIG. 1B. The second region A32' of the second substrate 351 may be covered by an insulating structure 353. The insulating structure 353 may include a single insulating layer or multilayer insulting layers. The second align mark 357 may be formed in the insulating structure 353. The second align mark 357 may include a conductive material.

Although not illustrated in FIG. 6B, a contact pad and a contact plug may be electrically coupled to the second align mark 357 to apply an electrical signal to the first align mark 357 from a rear surface side of the second substrate 351. The contact pad may be embedded in the second substrate 351 and the contact plug may pass through the insulating structure 353 to be coupled to the contact pad and to be coupled to the second align mark 357. Embodiments of structures of the contact pad and the contact plug are described below with reference to FIGS. 18C and 19C.

Referring to FIG. 6C, the first substrate 301 and the second substrate 351 may be orientated such that the first structure ST31 faces the second structure ST32.

Vertical capacitance VC between the first align mark 307 and the second align mark 357 may be measured to correctly align the first structure ST31 and the second structure ST32. When the measured vertical capacitance VC has a reference value, the first structure ST31 and the second structure ST32 may be coupled to each other.

The first align mark illustrated in FIGS. 1A, 5A, and 6A may be simultaneously formed with a part of elements included in the first structure. The second align mark illustrated in FIGS. 1B, 5B, and 6B may be simultaneously formed with a part of elements included in the second structure. Accordingly, embodiments of the present teachings may increase the alignment accuracy between the first structure and the second structure using the first align mark and the second align mark as described above. The second region of the first substrate at which the first align mark is formed and the second region of the second substrate at which the second align mark is formed may couple the first structure and the second structure and may be cut.

Hereinafter, embodiments in which the alignment between the first structure and the second structure is controlled are described in detail with an example in which the first structure includes a peripheral circuit and the second structure includes a three-dimensional memory cell array. Embodiments are not limited to the presented embodiments described herein. For example, the first structure described below may be replaced by a three-dimensional memory cell array and the second structure may be replaced by a peripheral circuit.

FIGS. 7A to 7C are cross-sectional diagrams illustrating a semiconductor memory device according to an embodiment.

Referring to FIG. 7A, a first structure STa and a second structure STb may be disposed between a first substrate 401 and a second substrate 501.

FIG. 7B is an enlarged view of region X shown in FIG. 7A.

Referring to FIG. 7B, the first structure STa may include a peripheral circuit including transistors TR, a first insulating structure IS1 covering the peripheral circuit, connection structures 417, 419, 423, and 429 passing through the first insulating structure IS1, a second insulating structure IS2 covering the connection structures 417, 419, 423, and 429, and first conductive contact patterns 433 passing through the second insulating structure IS2.

The transistors TR may be separated from each other by isolation layers 403 disposed in the first substrate 401. Active regions may be defined by the isolation layers 403 in the first substrate 401. Each of the transistors TR may include a gate insulating layer 411 formed over the active region, a gate electrode 413 formed on the gate insulating layer 411, impurity regions 405 formed at both sides of the gate electrode 413 in the first substrate 401. The impurity regions 405 may include an n-type or p-type dopant and serve as a source region or a drain region. The transistors TR may be connected to a memory cell array CAR illustrated in FIG. 7A and may control operations of the memory cell array CAR.

The first insulating structure IS1 may include one or more insulating layers 415 and 421. According to an embodiment, the first insulating structure IS1 may include at least one first etch stop layer 425. For example, the first insulating structure IS1 may include the first insulating layer 415 formed on the first substrate 401 to cover the transistors TR, the second insulating layer 421 formed on the first insulating layer 415, and the first etch stop layer 425 formed on the second insulating layer 421. A stacked structure of the first insulating structure IS1 is not limited to the embodiment illustrated in FIG. 7B but may be variously changed. The first etch stop layer 425 may include a material having a different etch rate from the second insulating layer 421. For example, the first insulating layer 415 and the second insulating layer 421 may include oxide layers and the first etch stop layer 425 may include a nitride layer.

The connection structures 417, 419, 423, and 429 may include the contact plugs 417 and 423 and the conductive pads 419 and 429. For example, the connection structures 417, 419, 423, and 429 may include the first contact plugs 417, the first conductive pads 419 each having a greater width than each of the first contact plugs 417, the second contact plugs 423 connected to the first conductive pads 419, and the second conductive pads 429 each having a greater width than each of the second contact plugs 423. The first contact plugs 417 may pass through the first insulating layer 415 to be connected to the impurity regions 405 and the gate electrode 413 of the transistors TR. The first conductive pads 419 may be disposed in the second insulating layer 421 and coupled to the first contact plugs 417. The second contact plugs 423 may be disposed in the second insulating layer 421 and coupled to the first conductive pads 419. The second conductive pads 429 may pass through the first etch stop layer 425 to be coupled to the second contact plugs 423.

The connection structures 417, 419, 423, and 429 are not limited to the embodiment illustrated in FIGS. 7A and 7B but may be variously changed. The connection structures 417, 419, 423, and 429 may include various conductive materials.

The second insulating structure IS2 may include a third insulating layer 427 and a second etch stop layer 431. The second etch stop layer 431 may be omitted in some embodiments. The third insulating layer 427 may include a material having a different etch rate from the second etch stop layer 431. For example, the third insulating layer 427 may include an oxide layer and the second etch stop layer 431 may include a nitride layer.

The first conductive contact patterns 433 may pass through the second insulating structure IS2 and may be electrically coupled to a peripheral circuit. For example, the first conductive contact patterns 433 may pass through the second etch stop layer 431 and the third insulating layer 427 to be connected to the second conductive pads 429. Accordingly, the first conductive contact patterns 433 may be coupled to the transistors TR via the connection structures 417, 419, 423, and 429.

Coupling between the first conductive contact patterns 433 and the peripheral circuit is not limited to the embodiment described above, but may be variously changed.

Each of the first conductive contact patterns 433 may include a protrusion 433P protruding farther than a surface of the second insulating structure IS2.

Referring to FIG. 7A, the second structure STb may include the memory cell array CAR, a third insulating structure IS3, bit lines BL, connection structures 527, 529, 535, 537, and 541, supports 523, a source contact structure SCT, and second conductive contact patterns 543. The third insulating structure IS3 may overlap the memory cell array CAR. The bit lines BL, the connection structures 527, 529, 535, 537, and 541, the supports 523, the source contact structure SCT, and the second conductive contact patterns 543 may be embedded in the third insulating structure IS3.

The memory cell array CAR may include memory strings STR coupled between a source region 503 and the bit lines BL. The source region 503 may be formed in the second substrate 501 and may include an impurity. The impurity of the source region 503 may include an n-type dopant.

FIG. 7C is an enlarged cross-sectional diagram of one of the memory strings STR.

Referring to FIG. 7C, gate electrodes of the memory strings STR may be coupled to conductive patterns 513 of a gate stacked structure GST.

The gate stacked structure GST may include interlayer insulating layers 511 and the conductive patterns 513 stacked alternately with each other over the second substrate 501 shown in FIG. 7A. The gate stacked structure GST may be penetrated by channel structures CH.

The channel structures CH may serve as channel regions of the memory strings STR. The channel structures CH may include semiconductor layers. A central region of each of the channel structures CH may be filled with a core insulating layer CO. One end of each of the channel structures CH may be coupled to the source region 503. The other end of each of the channel structures CH may be coupled to a doped pattern DP that overlaps the core insulating layer CO. The doped pattern DP may include an impurity, for example, an n-type dopant. The doped pattern DP may serve as a drain region.

A memory layer ML may be disposed between the corresponding conductive pattern 513 and the corresponding channel structure CH and may store data. The memory layer ML may include a tunnel insulating layer TI, a data storage layer DL, and a blocking insulating layer BI stacked on a sidewall of the corresponding channel structure CH towards a sidewall of the gate stacked structure GST. The tunnel insulating layer TI may include a silicon oxide enabling charge tunneling. The data storage layer DL may include a charge trap layer, a material layer including conductive nanodots, or a phase-change material layer. For example, the data storage layer DL may include silicon nitride, enabling charge trapping. The blocking insulating layer BI may include an oxide capable of blocking charges.

According to the structure described above, a source select transistor, memory cells, and a drain select transistor may be formed at intersections of the conductive patterns 513 and the channel structures CH. The source select transistor, the memory cells, and the drain select transistor may be coupled in series and may form the memory string STR corresponding thereto. A gate electrode of the source select transistor may be coupled to a source side conductive pattern adjacent to the source region 503 among the conductive patterns 513. A gate electrode of the drain select transistor may be coupled to a bit line side conductive pattern adjacent to the bit lines BL shown in FIG. 7A among the conductive patterns 513. Gate electrodes of the memory cells may be coupled to intermediate conductive patterns among the conductive patterns 513. The intermediate conductive patterns may be disposed between the source side conductive pattern and the bit line side conductive pattern.

Referring to FIG. 7A, the source contact structure SCT may pass through the gate stacked structure GST and transmit an electrical signal to the source region 503. The source contact structure SCT may be a single conductive layer or include two or more conductive layers. The source contact structure SCT and the gate stacked structure GST may be insulated from each other by a sidewall insulating layer 505 interposed therebetween.

The conductive patterns 513 of the gate stacked structure GST may include a contact region having a stepped structure. The contact region having the stepped structure may be penetrated by the plurality of supports 523.

The third insulating structure IS3 may include one or more insulating layers 521, 525, and 533. According to an embodiment, the third insulating structure IS3 may include a third etch stop layer 531. For example, the third insulating structure IS3 may include the fourth insulating layer 521, the fifth insulating layer 525, the third etch stop layer 531, and the sixth insulating layer 533. The fourth insulating layer 521 may be disposed over one surface of the second substrate 501 to cover the stepped structure of the gate stacked structure GST. The fifth insulating layer 525, the third etch stop layer 531, and the sixth insulating layer 533 may be sequentially stacked between the fourth insulating layer 521 and the first structure STa. The third insulating structure IS3 is not limited to the embodiment illustrated in FIG. 7A but may be variously changed. The third etch stop layer 531 may include a material having a different etch rate from the fourth, fifth, and sixth insulating layers 521, 525, and 533. For example, the fourth, fifth, and sixth insulating layers 521, 525, and 533 may include oxide layers and the third etch stop layer 531 may include a nitride layer.

The connection structures 527, 529, 535, 537, and 541 may include the contact plugs 527, 529, and 541 and the conductive pads 535 and 537 that are embedded in the third insulating structure IS3. For example, the connection structures 527, 529, 535, 537, and 541 may include the gate contact plugs 527, the drain contact plugs 529, the gate pads 535 each having a greater width than each of the gate contact plugs 527, the source pad 537 having a greater width than the source contact structure SCT, and the pad contact plugs 541.

The gate contact plugs 527 may contact the conductive patterns 513 of the gate stacked structure GST described above with reference to FIG. 7C and may extend to pass through the fourth insulating layer 521 and the fifth insulating layer 525. The source contact structure SCT may extend to pass through the fifth insulating layer 525. The drain contact plugs 529 may be coupled to the memory strings STR and may pass through the fifth insulating layer 525.

The gate pads 535 may contact the gate contact plugs 527. The source pad 537 may contact the source contact structure SCT. The bit lines BL may contact the drain contact plugs 529. The gate pads 535, the source pad 537, and the bit lines BL may pass through the third etch stop layer 531 and extend into the sixth insulating layer 533.

The pad contact plugs 541 may contact the gate pads 535, the source pad 537, and the bit lines BL and extend to pass through the sixth insulating layer 533.

The connection structures 527, 529, 535, 537, and 541 are not limited to the embodiment illustrated in FIG. 7A but may be variously changed. The connection structures 527, 529, 535, 537, and 541 may include various conductive materials.

The second conductive contact patterns 543 may contact the pad contact plugs 541 and may be embedded in an upper insulating layer 545. The second conductive contact patterns 543 may be coupled to the memory cell array CAR via the connection structures 527, 529, 535, 537, and 541. The upper insulating layer 545 may include a plurality of grooves 551 opening the second conductive contact patterns 543. The upper insulating layer 545 may be disposed between the first structure STa and the second structure STb.

The first structure STa and the second structure STb may be coupled to each other via the first conductive contact patterns 433 and the second conductive contact patterns 543. The protrusion 433P of the first conductive contact pattern 433 corresponding to the each of the grooves 551 may be aligned in each of the grooves 551 of the upper insulating layer 545. The first conductive contact patterns 433 and the second conductive contact patterns 543 may be coupled to each other via conductive adhesive patterns 561 filling the grooves 551. The conductive adhesive patterns 561 may include a cured material of silver epoxy resin or a cured material of a complex having silver nanoparticles, boron nitride, and epoxy.

The coupling between the first conductive contact patterns 433 and the second conductive contact patterns 543 might not be limited to the embodiment illustrated in FIG. 7A. For example, the first conductive contact patterns 433 and the second conductive contact patterns 543 may directly contact each other.

FIGS. 8A to 8G, 9, and 10 are cross-sectional diagrams illustrating a method of manufacturing a semiconductor memory device according to an embodiment. In diagrams described below, detailed explanation of the first structure and the second structure is the same as that described above with reference to FIGS. 7A, 7B, and 7C and is therefore not repeated.

FIGS. 8A to 8G are cross-sectional diagrams illustrating processing a first substrate to have a first structure and a first align mark.

Figure 8A:
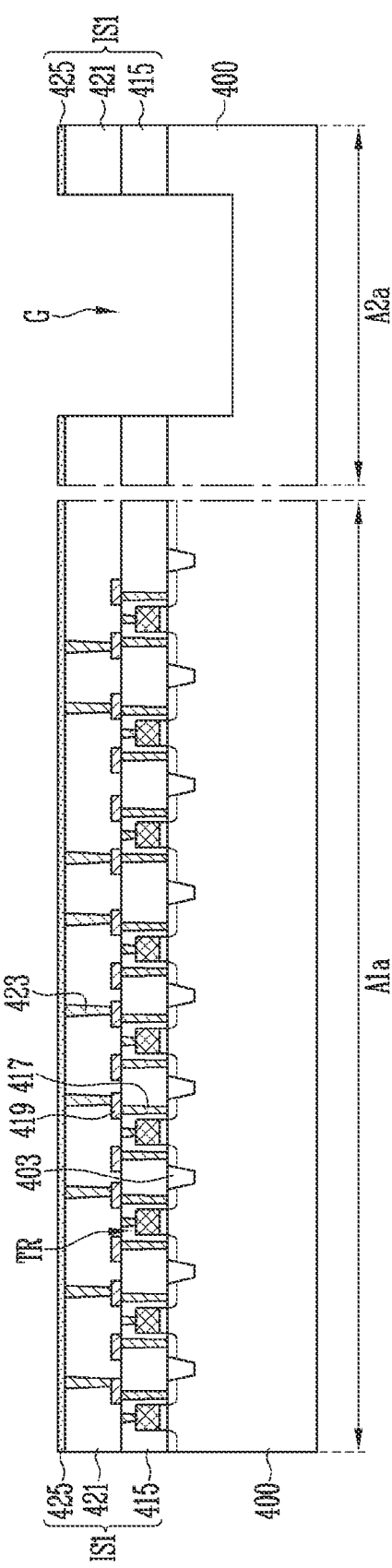

Referring to FIG. 8A, a first substrate 400 may include the same material as the first substrate 101 described above with reference to FIG. 1A. The first substrate 400 may include a first region A1a and a second region A2a.

A peripheral circuit including the transistors TR may be formed over the first region A1a of the first substrate 400. The transistors TR may be insulated from each other by the isolation layers 403 formed in the first substrate 400. The peripheral circuit including the transistors TR may be covered by the first insulating structure IS1. The first and second contact plugs 417 and 423 and the first conductive pads 419 may be embedded in the first insulating structure IS1.

The first insulating layer 415, the second insulating layer 421, and the first etch stop layer 425 which constitute the first insulating structure IS1 may extend to cover the second region A2a of the first substrate 400.

Subsequently, the first insulating structure IS1 and the second region A2a of the first substrate 400 may be etched to form the first groove G in the second region A2a of the first substrate 400.

Figure 8B:
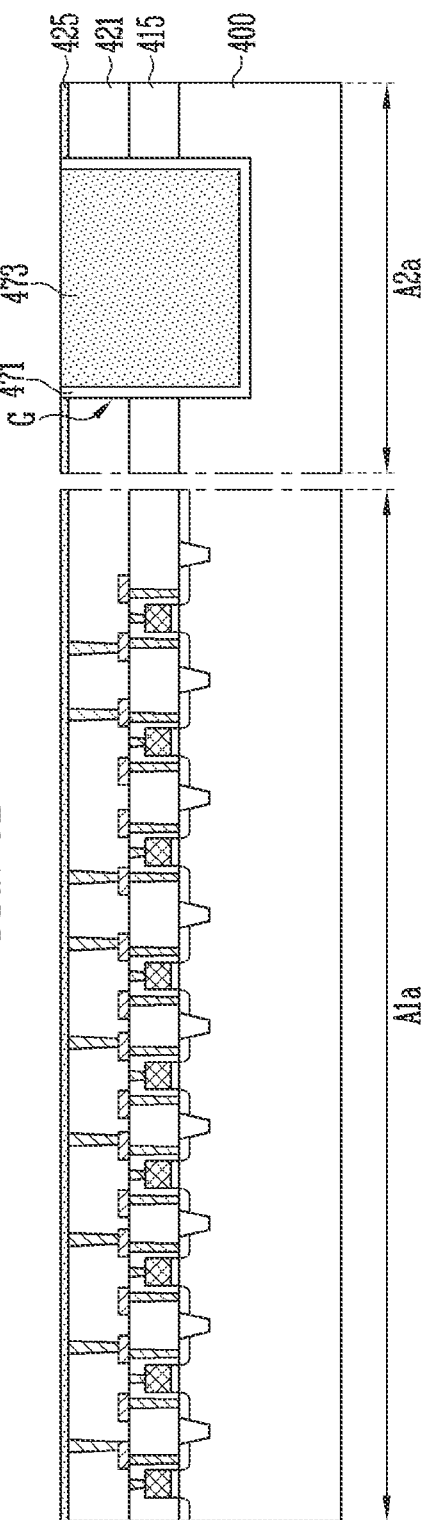

Referring to FIG. 8B, the first groove G may be filled with a sacrificial material 473. A first protective layer 471 may be formed on a surface of the first groove G before the first groove G is filled with the sacrificial material 473. The sacrificial material 473 may include a material having a different etch rate from the first protective layer 471, the first insulating layer 415, and the second insulating layer 421. For example, each of the first protective layer 471, the first insulating layer 415, and the second insulating layer 421 may include an oxide layer and the sacrificial material 473 may include a nitride layer.

Referring to FIG. 8C, the second conductive pads 429 passing through the first etch stop layer 425 of the first insulating structure IS1 and coupled to the second contact plugs 423 may be formed.

Subsequently, the second insulating structure IS2 extending to cover the second conductive pads 429 and the sacrificial material 473 may be formed on the first insulating structure IS1. The second insulating structure IS2 may include a stacked structure of the third insulating layer 427, the second etch stop layer 431, and the sacrificial insulating layer 451. The sacrificial insulating layer 451 may include an oxide layer.

Subsequently, the first conductive contact patterns 433 and a first align mark 475 that pass through the second insulating structure IS2 may be formed. The first align mark 475 may be formed using a process of forming the first conductive contact patterns 433. For example, forming the first conductive contact patterns 433 and the first align mark 475 may include forming a mask pattern (not illustrated) on the second insulating structure IS2, etching the second insulating structure IS2 by an etching process using the mask pattern as an etching barrier, filling regions where the second insulating structure IS2 is etched by a conductive material, and removing the mask pattern.

The first conductive contact patterns 433 may contact the second conductive pads 429 to be coupled to the peripheral circuit. The first align mark 475 may contact the sacrificial material 473.

Referring to FIG. 8D, the auxiliary groove AG may be formed by etching a part of the sacrificial insulating layer 451 to expose the first align mark 475 shown in FIG. 8C. Subsequently, a first align mark with a reduced length 475P as shown in FIG. 8D may be formed by removing an end portion of the first align mark 475 which is exposed by the auxiliary groove AG. The first align mark with the reduced length 475P may have a smaller length than each of the first conductive contact patterns 433.

A probability that the shape of the first align mark 475P, having a low aspect ratio due to the reduced length, is changed by effects of a subsequent process may be low. Therefore, according to an embodiment, the accuracy of measurement of degree of alignment may be improved using the first align mark with the reduced length 475P.

Figure 8E:
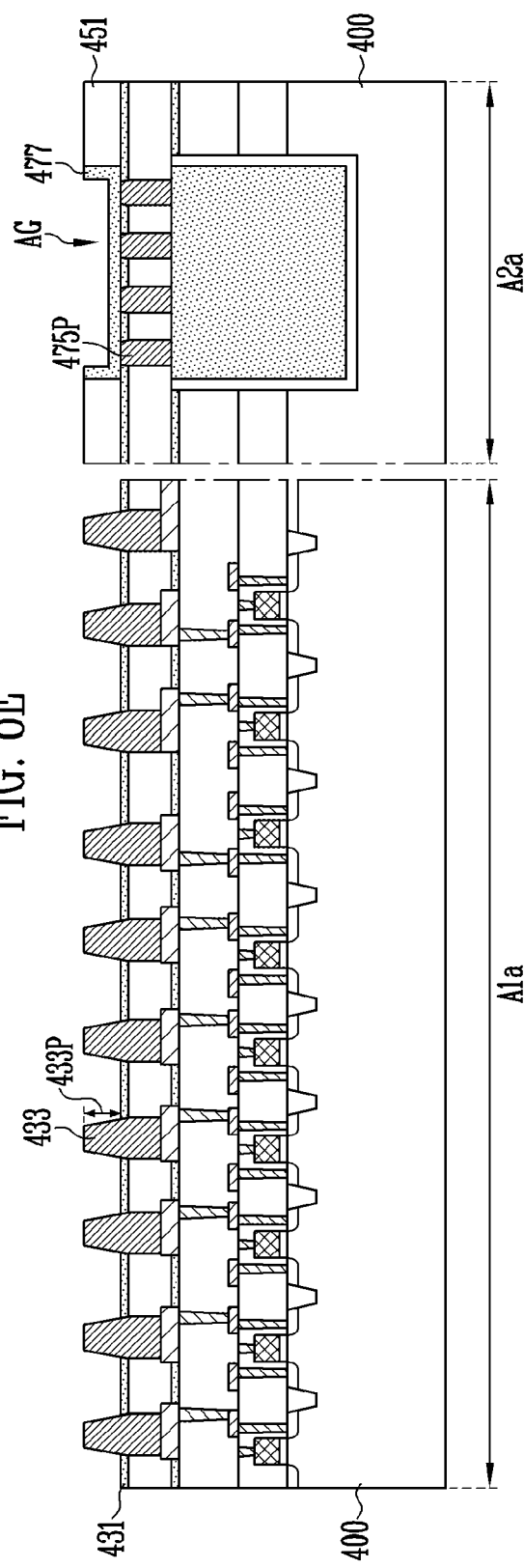

Referring to FIG. 8E, a second protective layer 477 may be formed on a surface of the auxiliary groove AG. The second protective layer 477 may include a material layer having a different etch rate from the sacrificial insulating layer 451. For example, the second protective layer 477 may include a nitride layer.

Subsequently, another part of the sacrificial insulating layer 451 disposed over the first region A1a of the first substrate 400 may be removed. Accordingly, the second etch stop layer 431 may be exposed and end portions of the first conductive contact patterns 433 may be exposed. The exposed end portions of the first conductive contact patterns 433 may be defined as protrusions 433P.

Subsequently, a part of the first substrate 400 may be etched from a rear surface of the first substrate 400. Accordingly, the sacrificial material 473 may be exposed and a first substrate with a reduced thickness 401 may remain as shown in FIG. 8F.

Figure 8F:
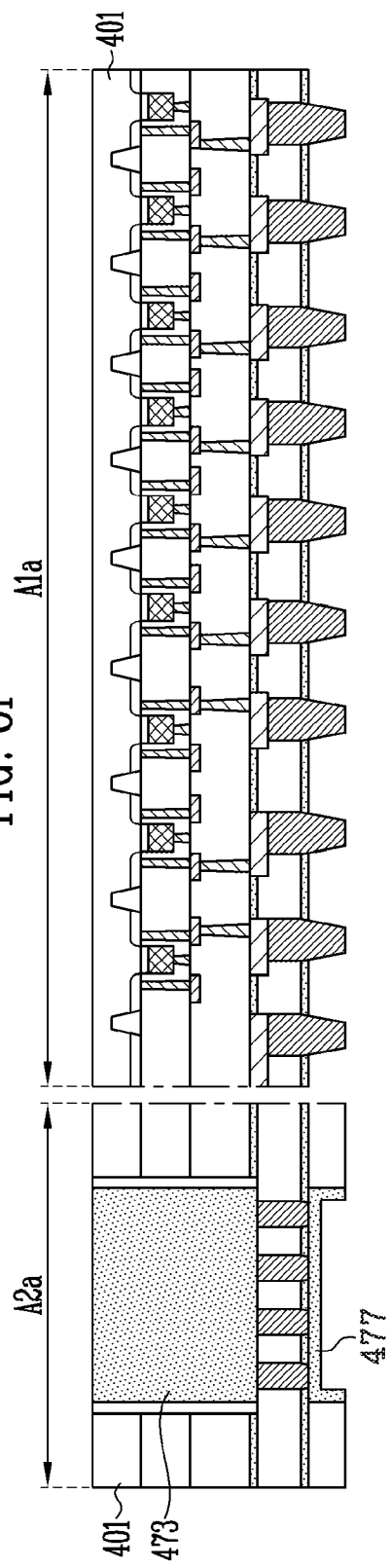
Figure 8G:
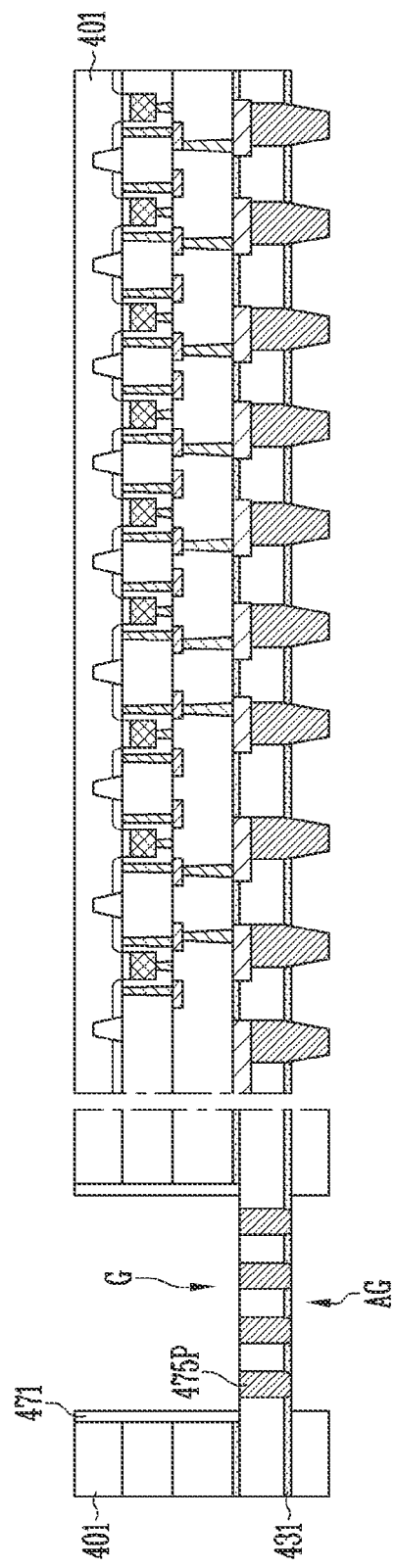

Referring to FIG. 8G, the first groove G may be opened by removing the sacrificial material 473 shown in FIG. 8F. When the sacrificial material 473 is removed, the second protective layer 477 shown in FIG. 8F may be removed. Accordingly, the first align mark with the reduced length 475P may be exposed by the first groove G and the auxiliary groove AG.

Figure 9:
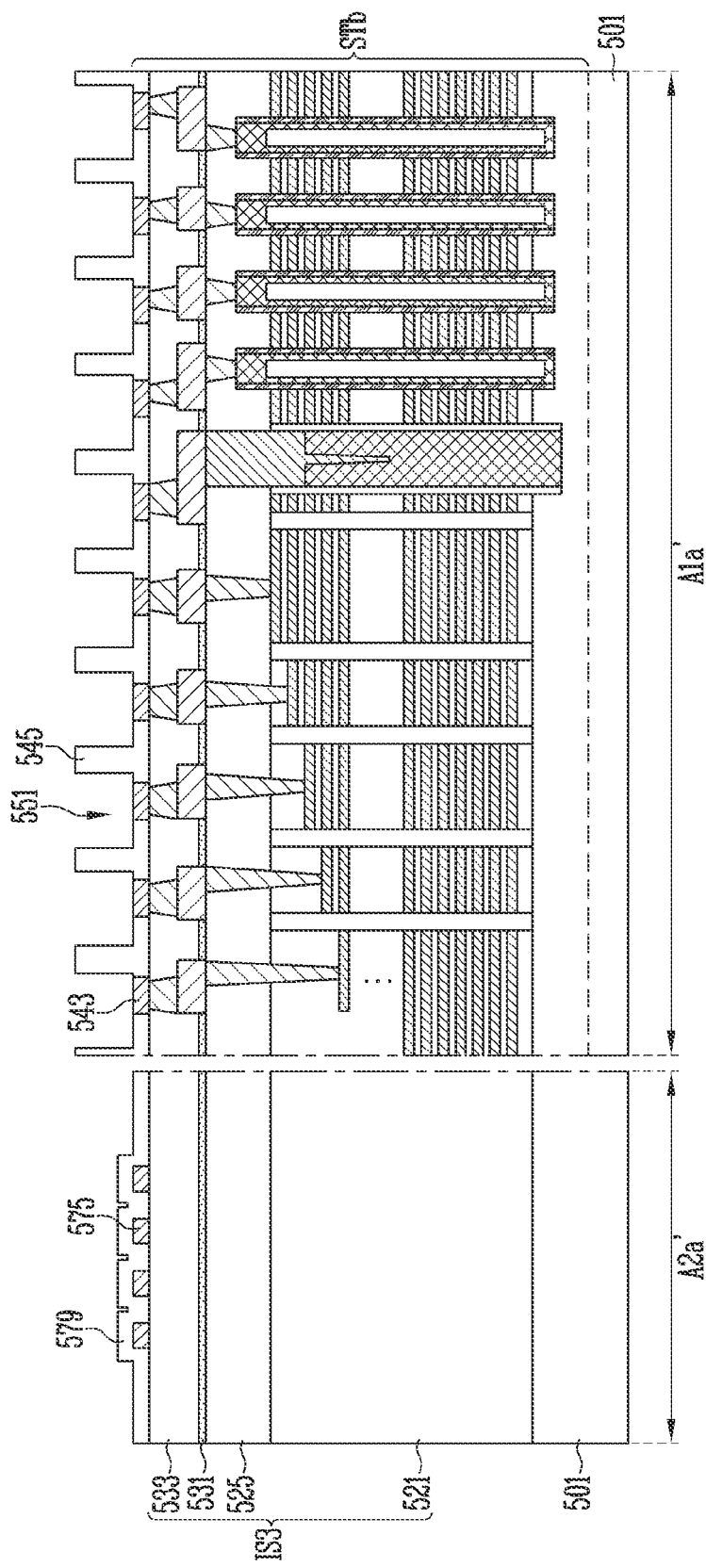

FIG. 9 is a cross-sectional diagram illustrating a second substrate including a second structure and a second align mark.

Referring to FIG. 9, the second substrate 501 may be processed to include the second structure STb described above with reference to FIGS. 7A and 7C. The second substrate 501 may include a first region A1a' and a second region A2a'.

The second structure STb may be formed over the first region A1a' of the second substrate 501. The fourth insulating layer 521, the fifth insulating layer 525, the third etch stop layer 531, and the sixth insulating layer 533 included in the third insulating structure IS3 of the second structure STb may extend over the second region A2a' of the second substrate 501.

A second align mark 575 may be formed over the second region A2a' of the second substrate 501 when the second conductive contact patterns 543 of the second structure STb are formed. Accordingly, the second align mark 575 may be formed from the same material as the second conductive contact patterns 543.

The second conductive contact patterns 543 may be embedded in the upper insulating layer 545 including the second grooves 551 and may be exposed by the second grooves 551. The second align mark 575 may be covered by a seventh insulating layer 579 conformally formed along a step defined by the second align mark 575.

Figure 10:
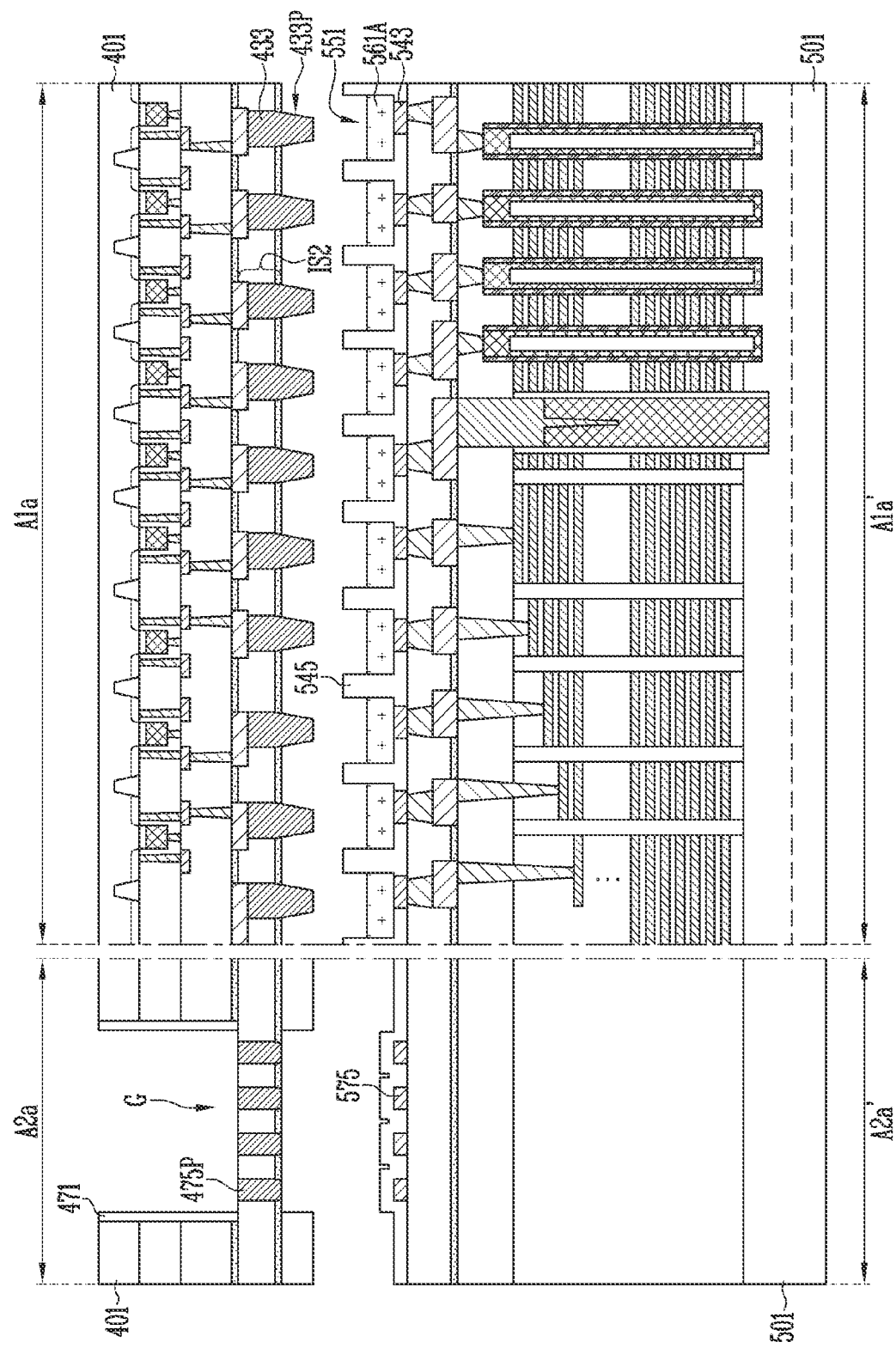

FIG. 10 is a cross-sectional diagram illustrating aligning the first substrate with the reduced thickness 401 and the second substrate 501 with each other.

Referring to FIG. 10, the second grooves 551 may be filled with a conductive adhesive material 561A. The conductive adhesive material 561A may be a flowable material for which the viscosity can be controlled by a solvent such as acetone or alcohol. For example, the conductive adhesive material 561A may include silver epoxy resin or a complex having silver nanoparticles, boron nitride, and epoxy. A height of the conductive adhesive material 561A having fluidity may be controlled such that the conductive adhesive material 561A does not overflow the second grooves 551 into an outside region during a subsequent process. For example, the height of the conductive adhesive material 561A may be adjusted to be less than a depth of each of the second grooves 551.

Subsequently, the first substrate with the reduced thickness 401 and the second substrate 501 may be orientated such that the first conductive contact patterns 433 face the second conductive contact patterns 543. The alignment of the first align mark with the reduced length 475P and the second align mark 575 may be detected through the first groove G. When the first align mark with the reduced length 475P and the second align mark 575 are correctly aligned, the upper insulating layer 545 may be adhered to the second insulating structure IS2 to dispose the protrusions 433P of the first conductive contact patterns 433 in the second grooves 551 and the conductive adhesive material 561A may be cured by heat. Accordingly, the first structure STa and the second structure STb coupled by the conductive adhesive pattern 561 shown in FIG. 7A may be formed.

After the first structure STa and the second structure STb are coupled to each other by the conductive adhesive pattern 561, the second region A2a of the first substrate 401 and the second region A2a' of the second substrate 501 shown in FIG. 10 may be removed by a cutting process as illustrated in FIG. 7A.

Figure 11:
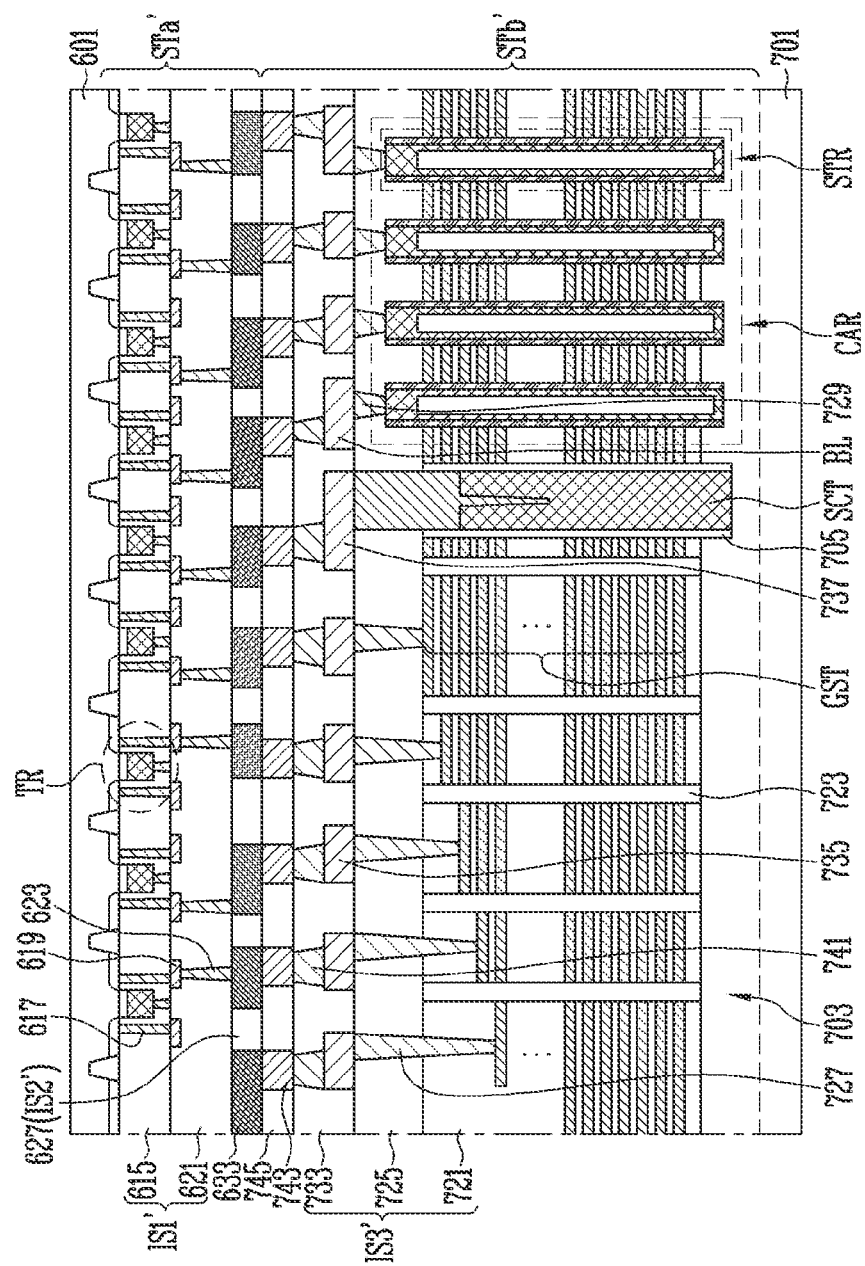
FIG. 11 is a cross-sectional diagram illustrating a semiconductor memory device according to an embodiment.

FIG. 11 is a cross-sectional diagram illustrating a semiconductor memory device according to an embodiment.

Referring to FIG. 11, a first structure STa' and a second structure STb' may be disposed between a first substrate 601 and a second substrate 701.

As described above with reference to FIGS. 7A and 7B, the first structure STa' may include a peripheral circuit including the transistors TR, a first insulating structure IS1' covering the peripheral circuit, connection structures 617, 619, and 623 passing through the first insulating structure IS1', a second insulating structure IS2' covering the connection structures 617, 619, and 623, and first conductive contact patterns 633 passing through the second insulating structure IS2'.

The first insulating structure IS1' may include one or more insulating layers. For example, the first insulating structure IS1' may include a first insulating layer 615 and a second insulating layer 621. Each of the first and second insulating layers 615 and 621 may include an oxide layer.

The connection structures 617, 619, and 623 may include the contact plugs 617 and 623 and the conductive pads 619 that pass through the first insulating structure IS1'. For example, the connection structures 617, 619, and 623 may include the first contact plugs 617, the conductive pads 619 each having a greater width than each of the first contact plugs 617, and the second contact plugs 623 connected to the conductive pads 619. The first contact plugs 617 and the second contact plugs 623 may have the same structures as the first contact plugs 417 and the second contact plugs 423 described above with reference to FIG. 7B. The conductive pads 619 may have the same structure as the first conductive pads 419 described above with reference to FIG. 7B.

The second insulating structure IS2' may include at least one insulating layer. For example, the second insulating structure IS2' may include a third insulating layer 627. The third insulating layer 627 may include an oxide layer.

The first conductive contact patterns 633 may pass through the second insulating structure IS2' and may be electrically coupled to the peripheral circuit. For example, the first conductive contact patterns 633 may pass through the third insulating layer 627 to contact the second contact plugs 623. Accordingly, the first conductive contact patterns 633 may be coupled to the transistors TR via the connection structures 617, 619, and 623.

The second structure STb' may include the memory cell array CAR, a third insulating structure IS3', the bit lines BL, connection structures 727, 729, 735, 737, and 741, supports 723, the source contact structure SCT, and second conductive contact patterns 743. The third insulating structure IS3' may overlap the memory cell array CAR. The bit lines BL and the connection structures 727, 729, 735, 737, and 741 may be embedded in the third insulating structure IS3'. The supports 723 and the source contact structure SCT may pass through the gate stacked structure GST. The second conductive contact patterns 743 may be coupled to the memory cell array CAR.

The memory cell array CAR may include the memory strings STR coupled between a source region 703 and the bit lines BL as described above with reference to FIG. 7A. The memory strings STR may have the same structure as the memory string STR illustrated in FIG. 7C.

As described above with reference to FIG. 7A, the source contact structure SCT may pass through the gate stacked structure GST and transmit an electrical signal to the source region 703. The source contact structure SCT and the gate stacked structure GST may be insulated from each other by a sidewall insulating layer 705 interposed therebetween.

The gate stacked structure GST and the supports 723 may have the same structures as the gate stacked structure GST and the supports 523 described above with reference to FIG. 7A.

The third insulating structure IS3' may include one or more insulating layers as described above with reference to FIG. 7A. For example, the third insulating structure IS3' may include a fourth insulating layer 721, a fifth insulating layer 725, and a sixth insulating layer 733.

The connection structures 727, 729, 735, 737, and 741 may include the contact plugs 727, 729, 741 and the conductive pads 735 and 737 that are embedded in the third insulating structure IS3' as described above with reference to FIG. 7A.

The second conductive contact patterns 743 may contact the pad contact plugs 741 among the contact plugs 727, 729, and 741 and may be embedded in an upper insulating layer 745. The second conductive contact patterns 743 may be coupled to the memory cell array CAR via the connection structures 727, 729, 735, 737, and 741.

The first structure STa' and the second structure STb' may be coupled to each other via the first conductive contact patterns 633 and the second conductive contact patterns 743 by direct contact between the first conductive contact patterns 633 and the second conductive contact patterns 743. The first conductive contact patterns 633 and the second conductive contact patterns 743 may include copper.

FIGS. 12A to 12G, 13, and 14 are cross-sectional diagrams illustrating a method of manufacturing a semiconductor memory device according to an embodiment. In diagrams described below, detailed explanation of the first structure and the second structure is the same as that described above with reference to FIG. 11 and is therefore not repeated.

FIGS. 12A to 12G are cross-sectional diagrams illustrating processing a first substrate to have a first structure and a first align mark.

Referring to FIG. 12A, a first substrate 600 may include the same material as the first substrate 101 described above with reference to FIG. 1A. The first substrate 600 may include a first region A1b and a second region A2b.

A peripheral circuit including the transistors TR may be formed over the first region A1b of the first substrate 600. The peripheral circuit including the transistors TR may be covered by the first insulating structure IS1'. The first and second contact plugs 617 and 623 and the conductive pads 619 may be embedded in the first insulating structure IS1'.

The first and second insulating layers 615 and 621 which constitute the first insulating structure IS1' may extend to cover the second region A2b of the first substrate 600.

Subsequently, the first insulating structure IS1' and the second region A2b of the first substrate 600 may be etched to form a groove G' in the second region A2b of the first substrate 600.

Referring to FIG. 12B, the groove G' may be filled with a sacrificial material 673. A first protective layer 671 may be formed on a surface of the groove G' before the groove G' is filled with the sacrificial material 673. The sacrificial material 673 and the first and second insulating layers 615 and 621 may include the same material. For example, each of the sacrificial material 673 and the first and second insulating layers 615 and 621 may include an oxide layer. The first protective layer 671 may include a material having a different etch rate from the sacrificial material 673 and the first and second insulating layers 615 and 621. For example, the first protective layer 671 may include a nitride layer.

Subsequently, the second insulating structure IS2' extending to cover the sacrificial material 673 may be formed on the first insulating structure IS1'. The second insulating structure IS2' may include the third insulating layer 627. The third insulating layer 627 may include an oxide layer.

Subsequently, a part of the second insulating structure IS2' may be etched to expose the sacrificial material 673. Subsequently, a region from which the second insulating structure IS2' is etched may be filled with a second protective layer 675. The second protective layer 675 may include a material having a different etch rate from the sacrificial material 673. For example, the second protective layer 675 may include a nitride layer.

Referring to FIG. 12C, the first conductive contact patterns 633 passing through the second insulating structure IS2' and a first align mark 683 passing through the second protective layer 675 may be formed. The first conductive contact patterns 633 and the first align mark 683 may be simultaneously formed using the processes described above with reference to FIG. 8C. The first conductive contact patterns 633 may include copper.

The first conductive contact patterns 633 may contact the second contact plugs 623 to be coupled to the peripheral circuit. The first align mark 683 may contact the sacrificial material 673.

Referring to FIG. 12D, a third protective layer 685 may be formed to cover the first conductive contact patterns 633 and the first align mark 683. The third protective layer 685 may include a material having a different etch rate from the sacrificial material 673. For example, the third protective layer 685 may include a nitride layer.

Subsequently, a part of the third protective layer 685 formed over the second region A2b of the first substrate 600 may be etched to form an auxiliary groove AG' exposing the first align mark 683. Subsequently, the auxiliary groove AG' may be filled with a fourth protective layer 687. The fourth protective layer 687 may include the same material as the sacrificial material 673. For example, the fourth protective layer 687 may include an oxide layer.

Subsequently, a part of the first substrate 600 may be etched from a rear surface of the first substrate 600. Accordingly, the sacrificial material 673 may be exposed and a first substrate 601 with a reduced thickness may remain as illustrated in FIG. 12E.

Figure 12E:
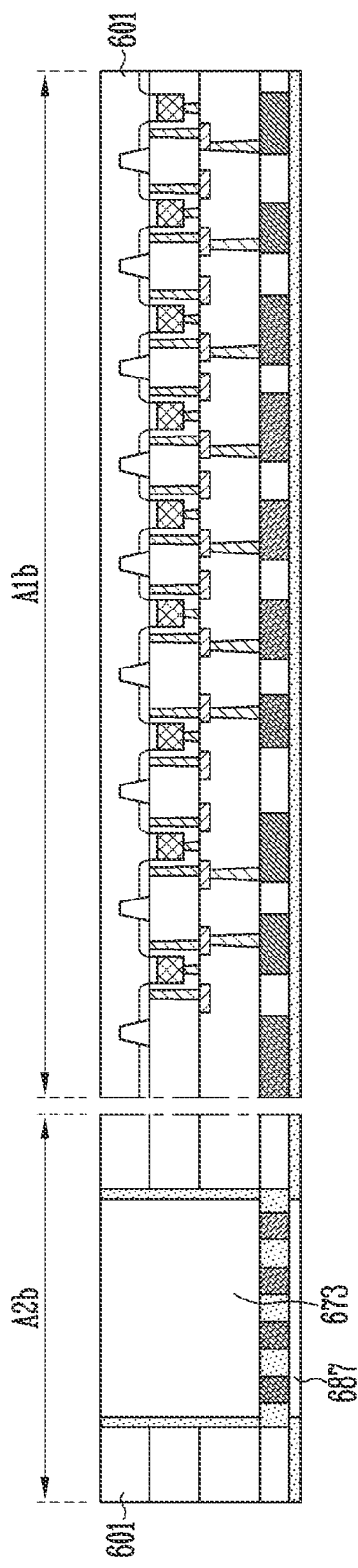
Figure 12F:
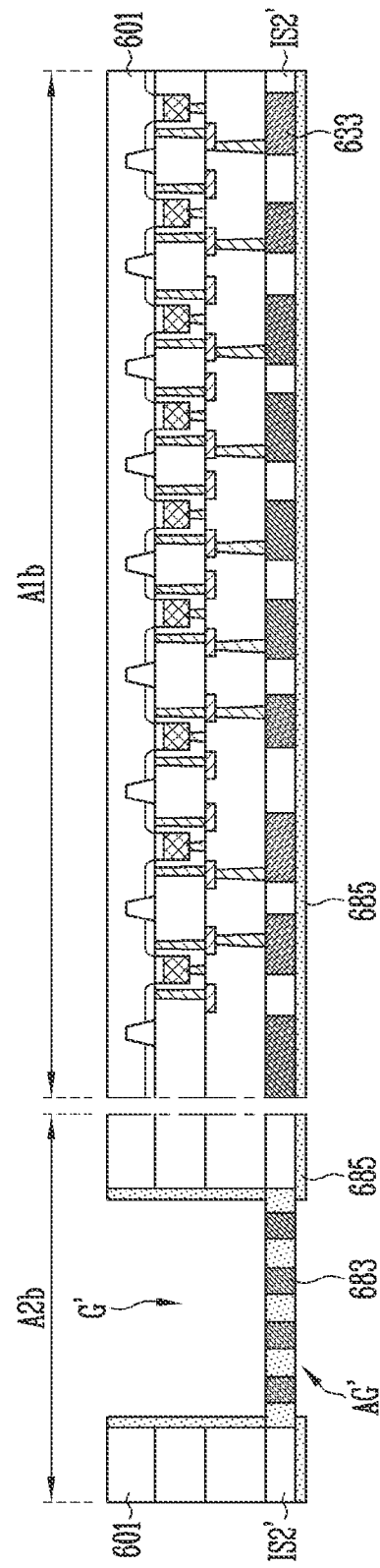

Referring to FIG. 12F, the groove G' may be opened by removing the sacrificial material 673 shown in FIG. 12E. When the sacrificial material 673 is removed, the fourth protective layer 687 shown in FIG. 12E may be removed and the auxiliary groove AG' may be opened. Accordingly, the first align mark 683 may be exposed by the groove G' and the auxiliary groove AG'. When the sacrificial material 673 is removed, the second insulating structure IS2' may be protected by the third protective layer 685.

Figure 12G:
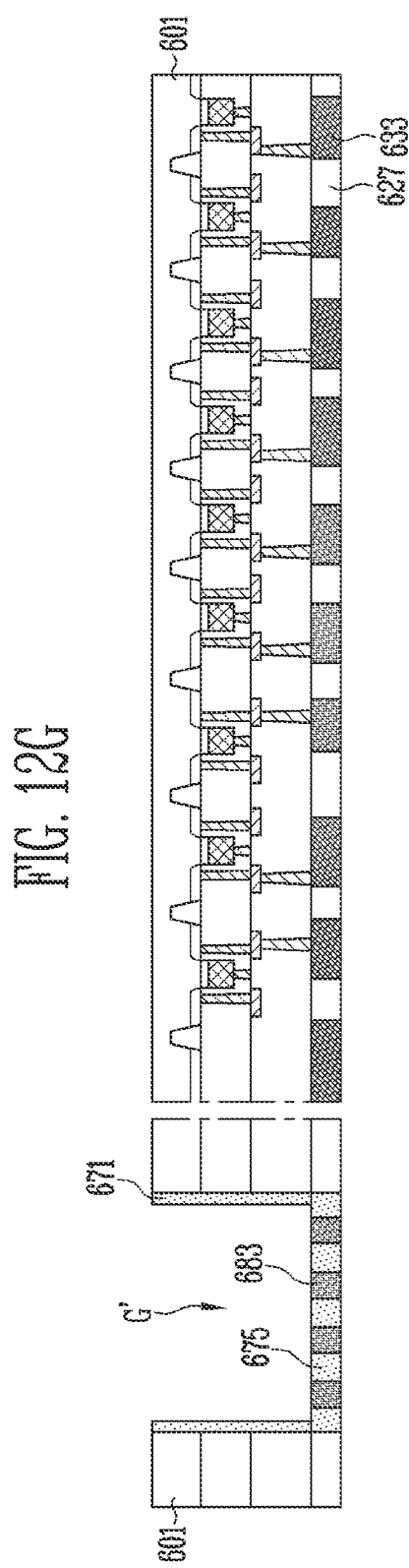

Referring to FIG. 12G, the first conductive contact patterns 633 may be exposed by removing the third protective layer 685 shown in FIG. 12F.

Figure 13:
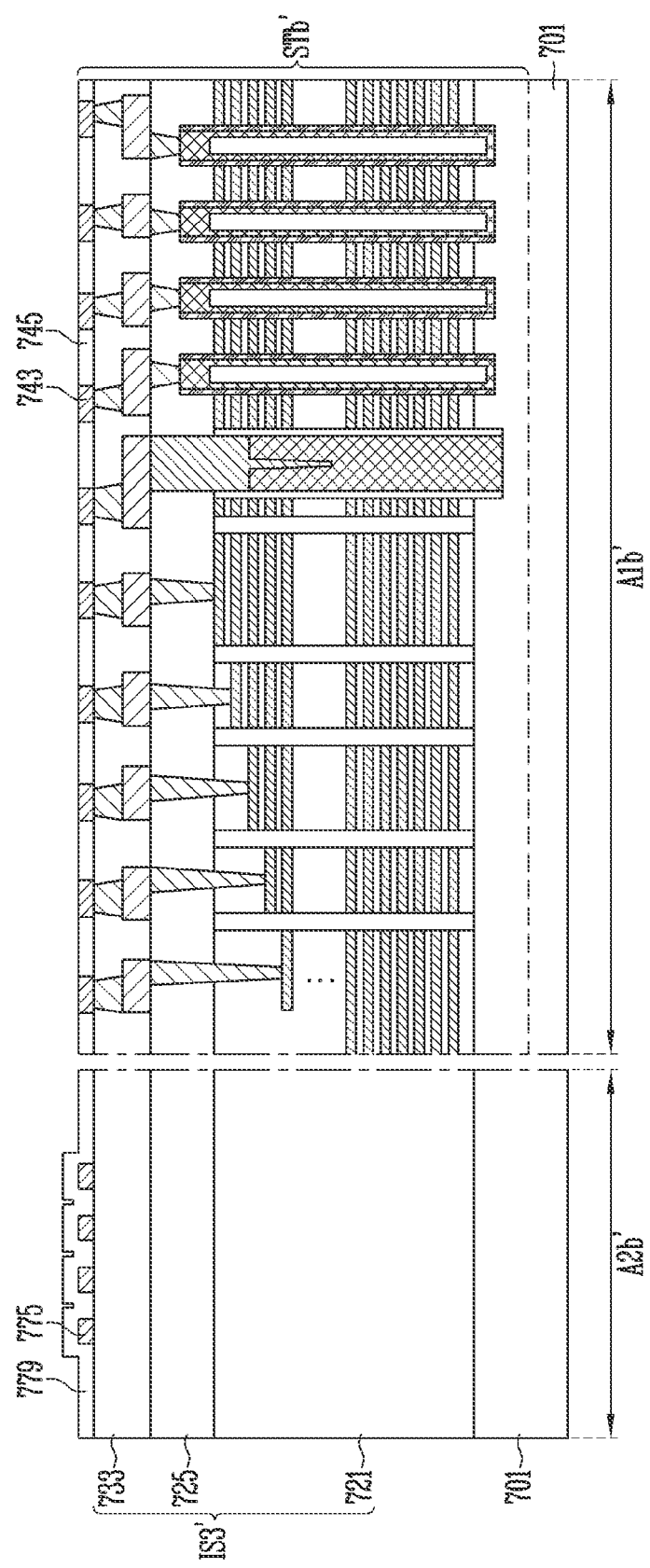

FIG. 13 is a cross-sectional diagram illustrating a second substrate including a second structure and a second align mark.

Referring to FIG. 13, the second substrate 701 may be processed to include the second structure STb' described above with reference to FIG. 11. The second substrate 701 may include a first region A1b' and a second region A2b'.

The second structure STb' may be formed over the first region A1b' of the second substrate 701. The fourth, fifth, and sixth insulating layers 721, 725, and 733 included in the third insulating structure IS3' of the second structure STb' may extend over the second region A2b' of the second substrate 701.

A second align mark 775 may be formed over the second region A2b' of the second substrate 701 when second conductive contact patterns 743 of the second structure STb' are formed. Accordingly, the second align mark 775 may be formed of the same material as the second conductive contact patterns 743. For example, the second conductive contact patterns 743 may include copper.

The second conductive contact patterns 743 may be embedded in the upper insulating layer 745 and one surface of each of the second conductive contact patterns 743 may be exposed. The second align mark 775 may be covered by a seventh insulating layer 779 conformally formed along a step defined by the second align mark 775.

FIG. 14 is a cross-sectional diagram illustrating aligning the first substrate 601 with the reduced thickness and the second substrate 701 with each other.

Referring to FIG. 14, the first substrate 601 with the reduced thickness and the second substrate 701 may be orientated such that the first conductive contact patterns 633 and the second conductive contact patterns 743 face each other. The alignment of the first align mark 683 and the second align mark 775 may be detected through the groove G'. When the first align mark 683 and the second align mark 775 are correctly aligned, the first conductive contact patterns 633 may contact the second conductive contact patterns 743. Subsequently, the first structure STa' and the second structure STb' coupled to each other by contact between the first conductive contact patterns 633 and the second conductive contact patterns 743 as illustrated in FIG. 11 may be formed by applying heat to the first conductive contact patterns 633 and the second conductive contact patterns 743 that are in contact with each other.

After the first structure STa' and the second structure STb' are coupled to each other as illustrated in FIG. 11, the second region A2b of the first substrate 601 and the second region A2b' of the second substrate 701 shown in FIG. 14 may be removed by a cutting process.

FIGS. 15A to 15D, 16A to 16E, and 17 are cross-sectional diagrams illustrating a method of manufacturing a semiconductor memory device according to an embodiment. In diagrams described below, detailed explanation of the first structure and the second structure is the same as that described above with reference to FIG. 11 and is therefore not repeated.

FIGS. 15A to 15D are cross-sectional diagrams illustrating processing a first substrate to have a first structure and a first align mark.

Figure 15A:
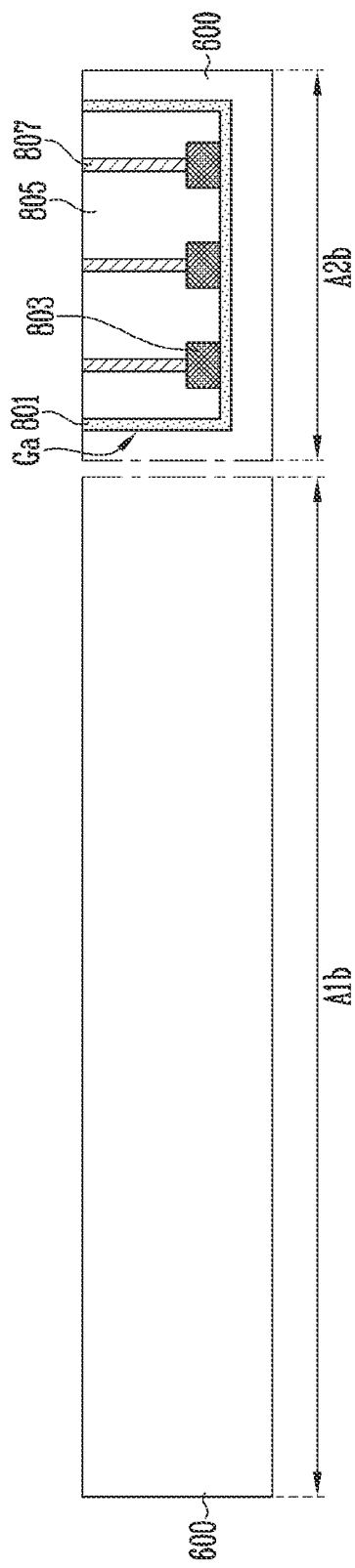
FIGS. 15A to 15D, 16A to 16E, and 17 are cross-sectional diagrams illustrating a method of manufacturing a semiconductor memory device according to an embodiment.

Referring to FIG. 15A, the first substrate 600 may include the same material as the first substrate 101 described above with reference to FIG. 1A. The first substrate 600 may include the first region A1b and the second region A2b.

A first groove Ga may be formed at the first substrate 600 by etching the second region A2b of the first substrate 600. Subsequently, a first lower etch stop layer 801 may be formed along a surface of the first groove Ga. Subsequently, first contact pads 803 may be formed on the first lower etch stop layer 801.

Subsequently, a first gap-fill insulating layer 805 covering the first contact pads 803 and filling the first groove Ga may be formed. Subsequently, first lower contact plugs 807 passing through the first gap-fill insulating layer 805 to be coupled to the first contact pads 803 may be formed.

The first lower etch stop layer 801 and the first gap-fill insulating layer 805 may have different etch rates. For example, the first gap-fill insulating layer 805 may include an oxide layer and the first lower etch stop layer 801 may include a nitride layer.

The first contact pads 803 and the first lower contact plugs 807 may include conductive materials.

Figure 15B:
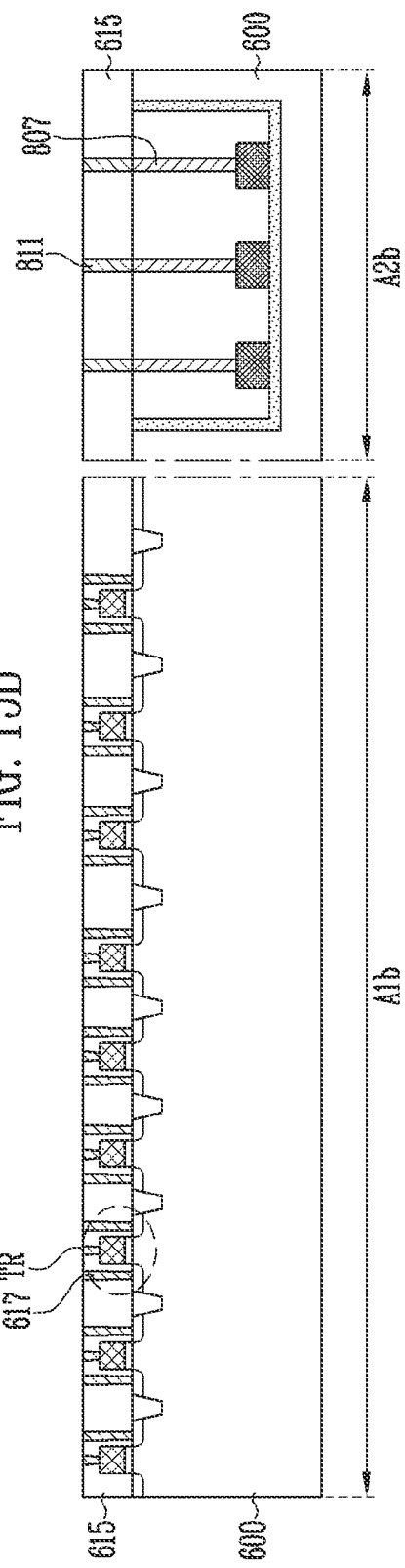

Referring to FIG. 15B, a peripheral circuit including the transistors TR may be formed over the first region A1b of the first substrate 600. Subsequently, the first insulating layer 615 may be formed over the first substrate 600. The first insulating layer 615 may extend to cover the peripheral circuit including the transistors TR and the first lower contact plugs 807.

Subsequently, the first contact plugs 617 and first upper contact plugs 811 that pass through the first insulating layer 615 may be formed. The first contact plugs 617 may be coupled to the transistors TR. The first upper contact plugs 811 may be coupled to the first lower contact plugs 807.

The first upper contact plugs 811 and the first contact plugs 617 may be formed at the same time. The first contact plugs 617 and the first upper contact plugs 811 may include conductive materials.

Figure 15C:
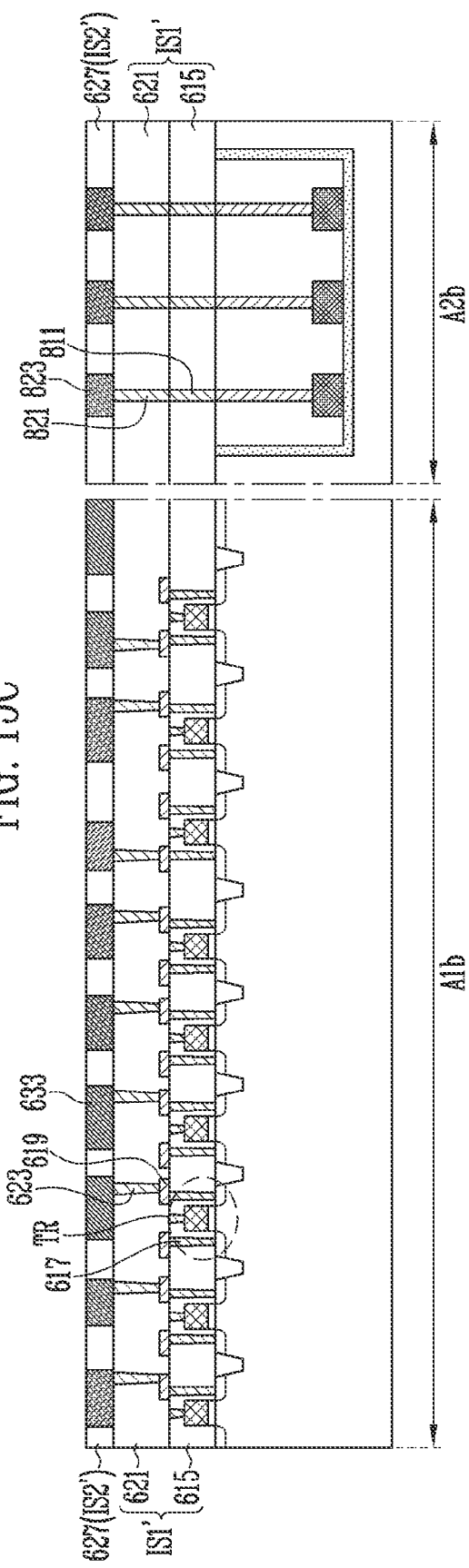

Referring to FIG. 15C, the conductive pads 619 coupled to the first contact plugs 617 may be formed. Subsequently, the second insulating layer 621 may be formed on the first insulating layer 615. Accordingly, the first insulating structure IS1' including the first insulating layer 615 and the second insulating layer 621 may be formed.

The second insulating layer 621 may extend to cover the conductive pads 619 and the first upper contact plugs 811. Subsequently, the second contact plugs 623 and second upper contact plugs 821 that pass through the second insulating layer 621 may be formed. The second contact plugs 623 may be coupled to the conductive pads 619. The second upper contact plugs 821 may be coupled to the first upper contact plugs 811.

The second upper contact plugs 821 and the second contact plugs 623 may be formed at the same time. The second contact plugs 623 and the second upper contact plugs 821 may include conductive materials.

Subsequently, the second insulating structure IS2' may be formed on the first insulating structure IS1'. The second insulating structure IS2' may include the third insulating layer 627 and the third insulating layer 627 may include an oxide layer. The second insulating structure IS2' may extend to cover the second contact plugs 623 and the second upper contact plugs 821.

Subsequently, the first conductive contact patterns 633 and first capacitor electrodes 823 that pass through the second insulating structure IS2' may be formed. The first capacitor electrodes 823 may constitute a first align mark and may be spaced apart from each other. The first conductive contact patterns 633 and the first capacitor electrodes 823 may be formed at the same time using the processes described above with reference to FIG. 8C. The first conductive contact patterns 633 may include copper.

The first conductive contact patterns 633 may contact the second contact plugs 623 to be coupled to the peripheral circuit. The first capacitor electrodes 823 may contact the second upper contact plugs 821.

Figure 15D:
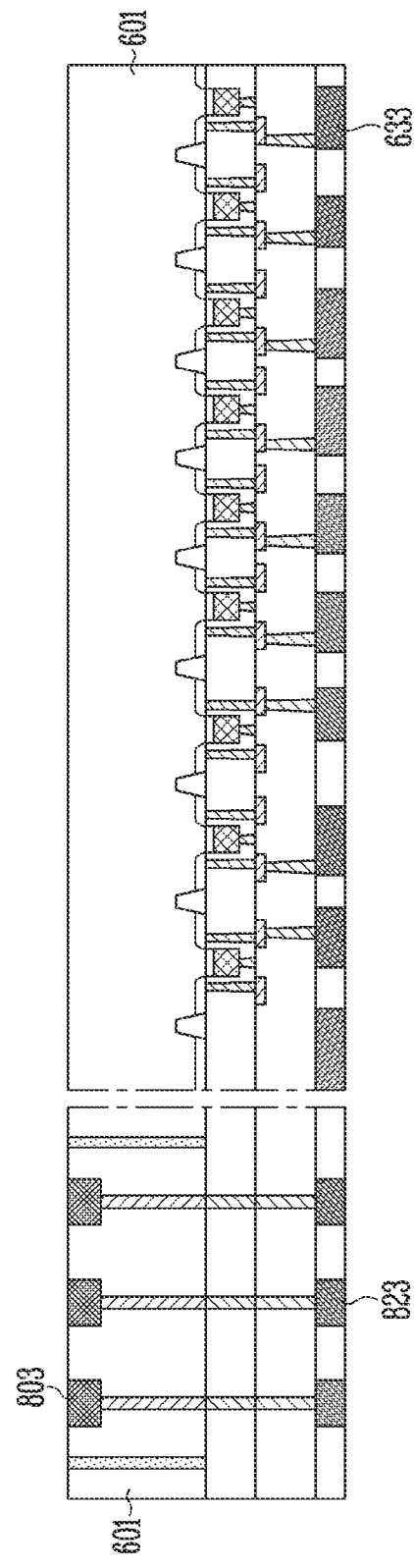

Subsequently, a part of the first substrate 600 may be etched from the rear surface of the first substrate 600. Accordingly, the first contact pads 803 may be exposed and the first substrate 601 with the reduced thickness may remain as illustrated in FIG. 15D.

FIGS. 16A to 16E are cross-sectional diagrams illustrating processing a second substrate to have a second structure and a second align mark.

Referring to FIG. 16A, a second substrate 700 may include the same material as the second substrate 151 described above with reference to FIG. 1B. The second substrate 700 may include the first region A1b' and the second region A2b'.

A second groove Gb may be formed in the second substrate 700 by etching the second region A2*b*' of the second substrate 700. Subsequently, a second lower etch stop layer 851 may be formed along a surface of the second groove Gb. Subsequently, second contact pads 853 may be formed on the second lower etch stop layer 851.

Subsequently, a second gap-fill insulating layer 855 covering the second contact pads 853 and filling the second groove Gb may be formed. Subsequently, second lower contact plugs 857 passing through the second gap-fill insulating layer 855 to be coupled to the second contact pads 853 may be formed.

The second lower etch stop layer 851 and the second gap-fill insulating layer 855 may have different etch rates. For example, the second gap-fill insulating layer 855 may include an oxide layer and the second lower etch stop layer 851 may include a nitride layer.

The second contact pads 853 and the second lower contact plugs 857 may include conductive materials.

Figure 16B:
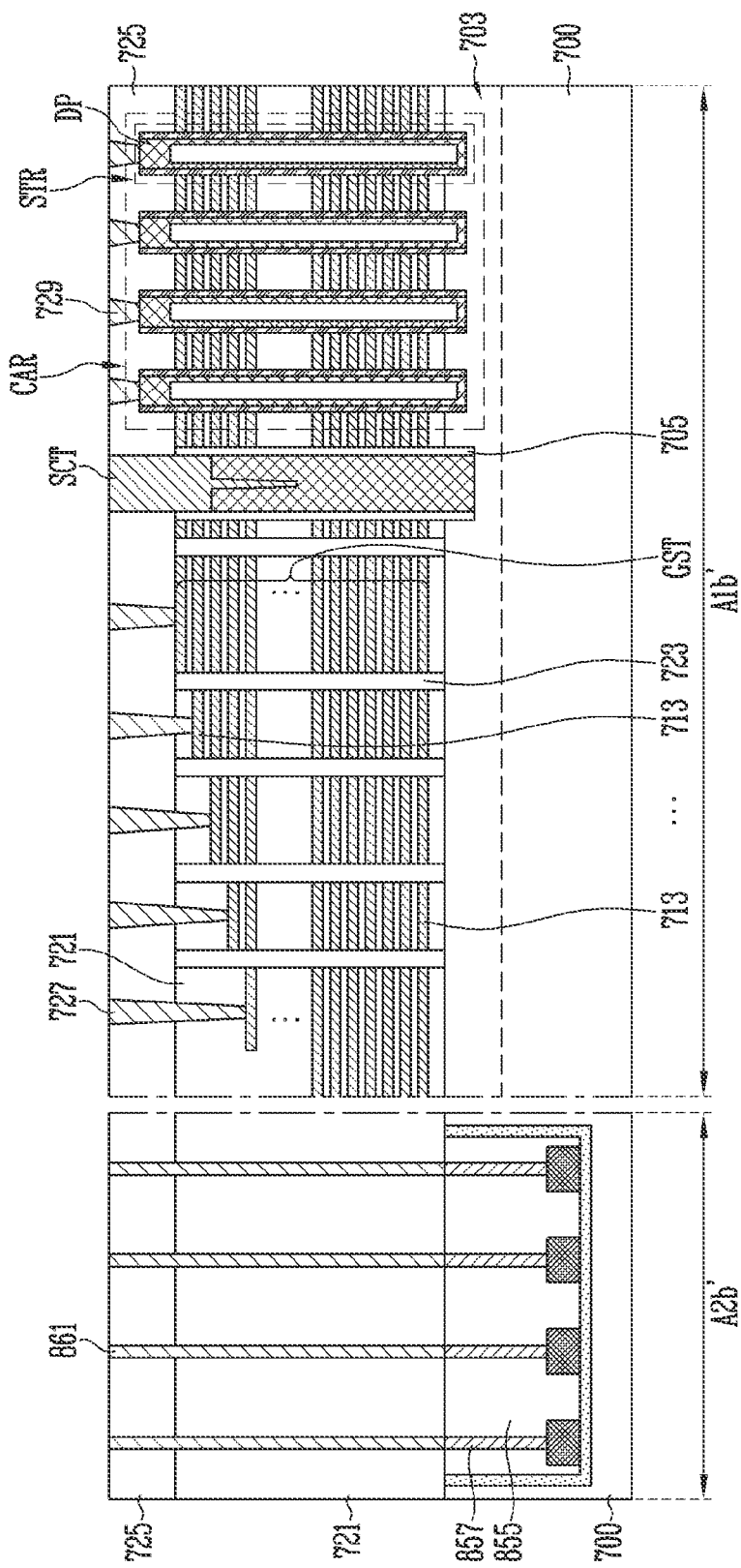
Figure 16H:
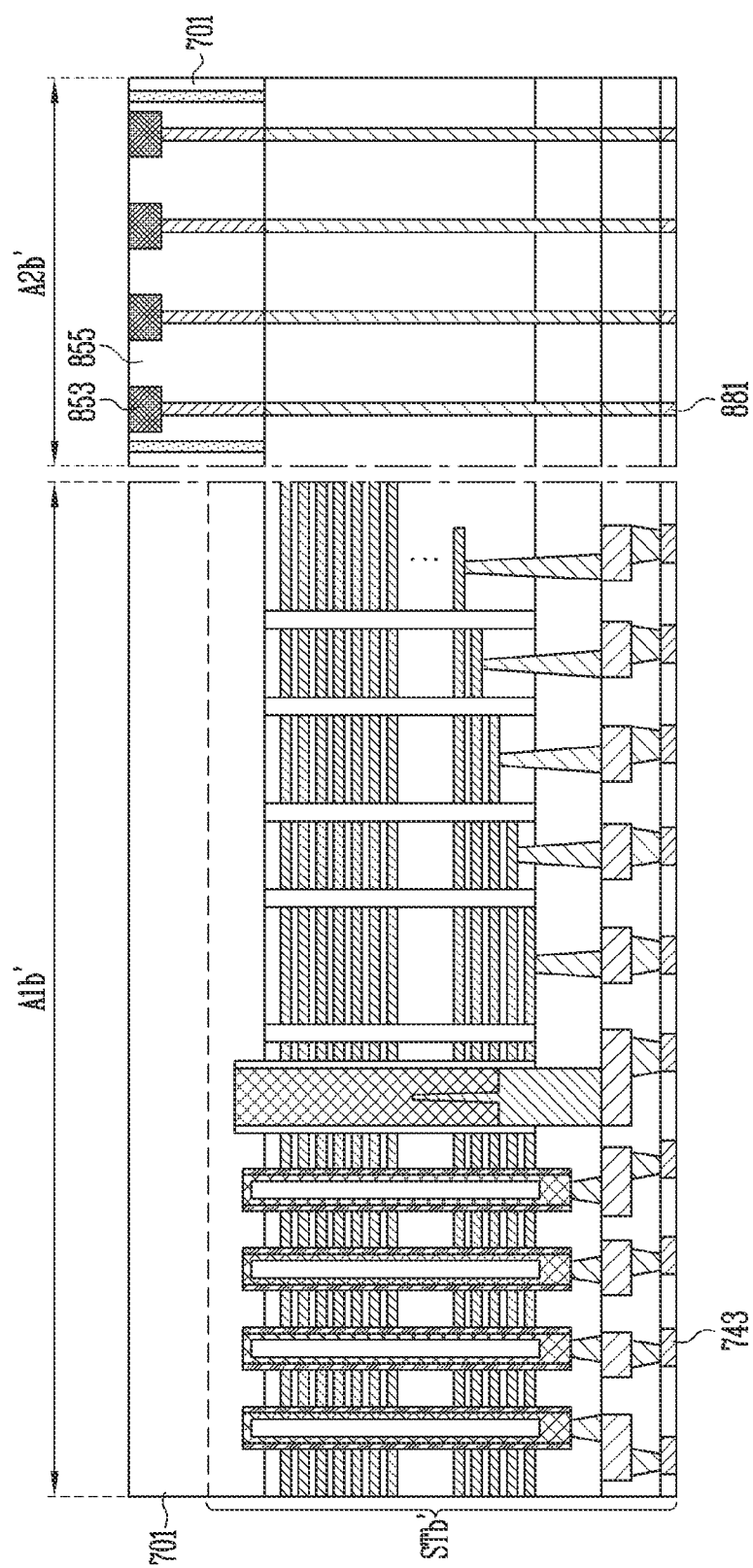

Referring to FIG. 16B, the memory cell array CAR including the memory strings STR coupled to the source region 703 may be formed over the first region A1*b*' of the second substrate 700. The source region 703 may be formed by injecting a source dopant into the first region A1*b*' of the second substrate 700. The memory strings STR may have the same structure as the memory strings STR described above with reference to FIG. 11.

The gate stacked structure GST coupled to the memory strings STR may be penetrated by the supports 723 and may include a stepped end portion. The stepped end portion of the gate stacked structure GST may be covered by the fourth insulating layer 721. The fourth insulating layer 721 may extend over the second region A2*b*' of the second substrate 700 to cover the second gap-fill insulating layer 855 and the second lower contact plugs 857.

Subsequently, the fifth insulating layer 725 may be formed to cover the memory strings STR. The fifth insulating layer 725 may be formed on the fourth insulating layer 721 and may extend over the second region A2*b*' of the second substrate 700. The fifth insulating layer 725 may be penetrated by the source contact structure SCT. The source contact structure SCT may pass through the gate stacked structure GST to contact the source region 703. The sidewall insulating layer 705 may be formed between the source contact structure SCT and the gate stacked structure GST.

Subsequently, third upper contact plugs 861, the gate contact plugs 727, and the drain contact plugs 729 that pass through at least one of the fifth insulating layer 725 and the fourth insulating layer 721 may be formed. Forming the third upper contact plugs 861, forming the gate contact plugs 727, and forming the drain contact plugs 729 may be separately performed. The third upper contact plugs 861, the gate contact plugs 727, and the drain contact plugs 729 may include conductive materials.

The third contact plugs 861 may extend to contact the second lower contact plugs 857. The gate contact plugs 727 may extend to contact the conductive patterns 713 of the gate stacked structure GST. The drain contact plugs 729 may extend to contact the doped patterns DP of the memory strings STR.

Referring to FIG. 16C, the gate pads 735 each having a greater width than each of the gate contact plugs 727, the source pad 737 having a greater width than the source contact structure SCT, and the bit lines BL may be formed on the fifth insulating layer 725. The gate pads 735 may be coupled to the gate contact plugs 727, the source pad 737 may be coupled to the source contact structure SCT, and the bit lines BL may be coupled to the drain contact plugs 729.

Subsequently, the sixth insulating layer 733 covering the gate pads 735, the source pad 737, and the bit lines BL may be formed. The sixth insulating layer 733 may extend over the second region A2*b*' of the second substrate 700. Accordingly, the third insulating structure IS3' including the fourth, fifth, and sixth insulating layers 721, 725, 733 may be formed.

Subsequently, fourth upper contact plugs 871 and the pad contact plugs 741 that pass through the sixth insulating layer 733 may be formed. The fourth upper contact plugs 871 and the pad contact plugs 741 may be formed by the same process and may include the same conductive material. The fourth upper contact plugs 871 may extend to contact the third upper contact plugs 861. The pad contact plugs 741 may extend to contact the gate pads 735, the source pad 737, and the bit lines BL.

Referring to FIG. 16D, the upper insulating layer 745 may be formed on the third insulating structure IS3'. Subsequently, the second conductive contact patterns 743 and second capacitor electrodes 881 that pass through the upper insulating layer 745 may be formed. The second capacitor electrodes 881 may constitute a second align mark and may be spaced apart from each other. The second conductive contact patterns 743 and the second capacitor electrodes 881 may be formed by the same process and may include the same conductive material. The second conductive contact patterns 743 may include copper.

The second capacitor electrodes 881 may extend to contact the fourth upper contact plugs 871. The second conductive contact patterns 743 may extend to contact the pad contact plugs 741.

Subsequently, a part of the second substrate 700 may be etched from a rear surface of the second substrate 700. Accordingly, the second contact pads 853 may be exposed and the second substrate 701 with a reduced thickness may remain as illustrated in FIG. 16E.

Figure 17:
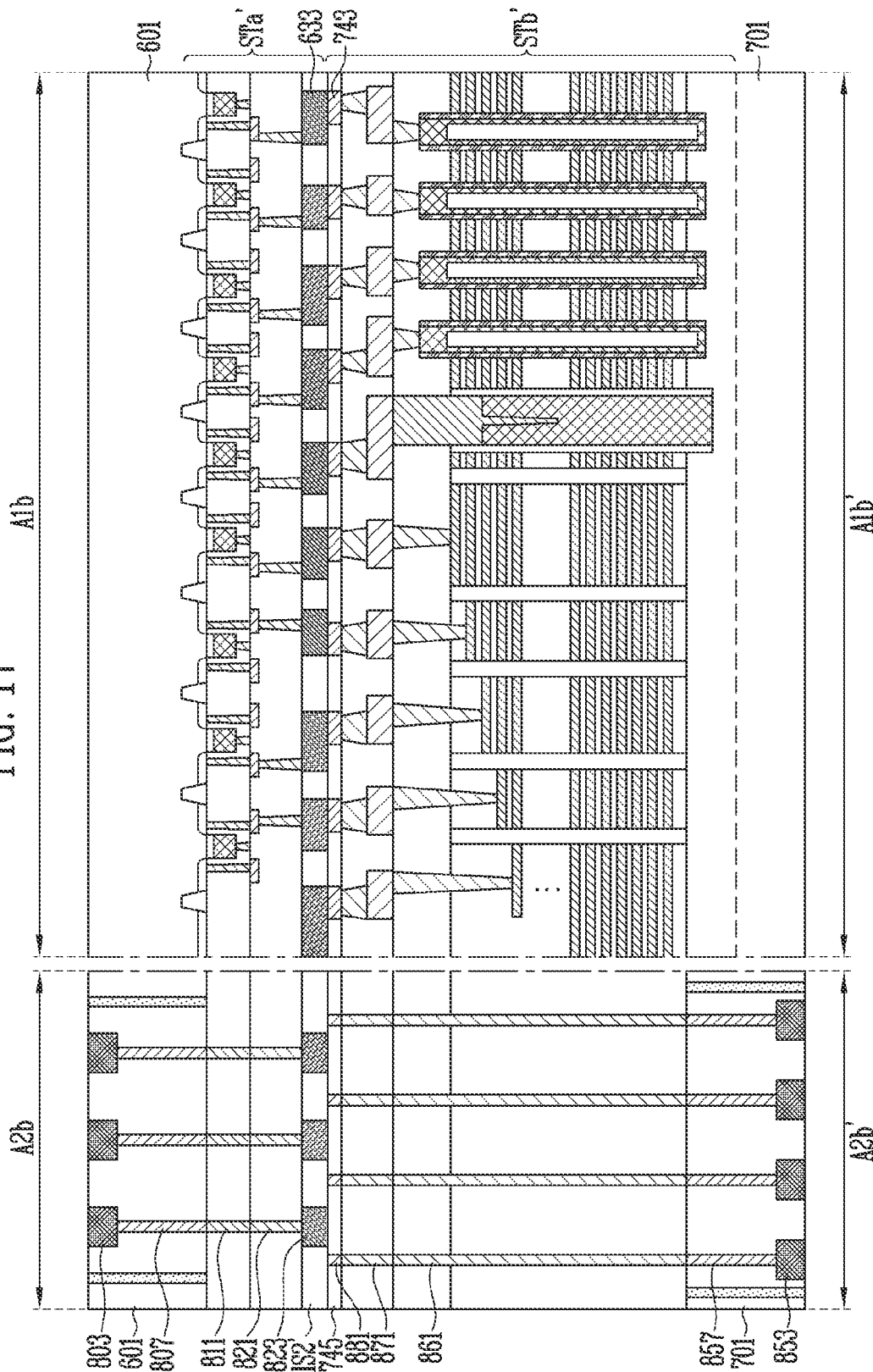

FIG. 17 is a cross-sectional diagram illustrating aligning the first substrate 601 with the reduced thickness and the second substrate 701 with the reduced thickness with each other.

Referring to FIG. 17, the first substrate 601 with the reduced thickness and the second substrate 701 with the reduced thickness may be orientated such that the first conductive contact patterns 633 and the second conductive contact patterns 743 face each other. Capacitance between the first capacitor electrodes 823 forming the first align mark and the second capacitor electrodes 881 forming the second align mark may be measured.

The first capacitor electrodes 823 and the second capacitor electrodes 881 may be alternately aligned in a horizontal direction as shown. When capacitances between the first capacitor electrodes 823 and the second capacitor electrodes 881 that neighbor each other is measured and have values within margin of error and it is determined that the first substrate 601 and the second substrate 701 are correctly aligned, the first conductive contact patterns 633 may be coupled to the second conductive contact patterns 743. Accordingly, the first structure STa' and the second structure STb' coupled to each other via the first conductive contact patterns 633 and the second conductive contact patterns 743 may be formed as illustrated in FIG. 11. The first conductive contact patterns 633 and the second conductive contact patterns 743 may be treated by heat to couple the first structure STa' and the second structure STb'.

Capacitances between the first capacitor electrodes 823 and the second capacitor electrodes 881 may be measured by applying electrical signals through the first contact pads 803 and the second contact pads 853. The signal applied to the first contact pads 803 may be applied to the first capacitor electrodes 823 via the first lower contact plugs 807, the first upper contact plugs 811, and the second upper contact plugs 821. The signal applied to the second contact pads 853 may be applied to the second capacitor electrodes 881 via the second lower contact plugs 857, the third upper contact plugs 861, and the fourth upper contact plugs 871. In an alternative embodiment, alignment between the first structure STa' and the second structure STb' may be checked by determining whether there is a bridged pair of the first capacitor electrode 823 and the second capacitor electrode 881. The bridged pair of the first capacitor electrode 823 and the second capacitor electrode 881 may be measured by determining a current between each pair of the first contact pad 803 and the second contact pad 853.

After the first structure STa' and the second structure STb' are coupled to each other, the second region A2b of the first substrate 601 and the second region A2b' of the second substrate 701 may be removed by a cutting process.

Although not illustrated in detail, a manufacturing method consistent with embodiments described above with reference to FIGS. 15A to 15D, 16A to 16E, and 17 may be used to form the semiconductor memory device shown in FIGS. 7A to 7C.

FIGS. 18A to 18C, 19A to 19C, and 20 are cross-sectional diagrams illustrating a method of manufacturing a semiconductor memory device according to an embodiment. In diagrams described below, detailed explanation of the first structure and the second structure is the same as that described above with reference to FIG. 11 and is therefore not repeated.

FIGS. 18A to 18C are cross-sectional diagrams illustrating processing a first substrate to have a first structure and a first align mark.

Referring to FIG. 18A, the first substrate 600 may include the same material as the first substrate 101 described above with reference to FIG. 1A. The first substrate 600 may include the first region A1b and the second region A2b.

A first groove Ga' may be formed at the second region A2b of the first substrate 600. A first lower etch stop layer 901, a first contact pad 903, a first gap-fill insulating layer 905, and a first lower contact plug 907 may be disposed in the first groove Ga'. The first groove Ga', the first lower etch stop layer 901, the first contact pad 903, the first gap-fill insulating layer 905, and the first lower contact plug 907 may be formed using the processes described above with reference to FIG. 15A.

Subsequently, the first insulating layer 615 may be formed on the first substrate 600 after a peripheral circuit including the transistors TR at the first region A1b of the first substrate 600. The first insulating layer 615 may extend to cover the peripheral circuit including the transistors TR and the first lower contact plug 907.

Subsequently, the first contact plugs 617 and a first upper contact plug 911 that pass through the first insulating layer 615 may be formed. The first contact plugs 617 may be coupled to the transistors TR. The first upper contact plug 911 may be coupled to the first lower contact plug 907. The first contact plugs 617 and the first upper contact plug 911 may be formed at the same time and may be formed of the same conductive material.

Subsequently, the conductive pads 619, the second contact plugs 623, and a first align mark 923 that are embedded in the second insulating layer 621 may be formed. The first insulating layer 615 and the second insulating layer 621 may be included in the first insulating structure IS1'.

The second insulating layer 621, the conductive pads 619, and the second contact plugs 623 may be formed using the processes described above with reference to FIG. 15C. The first align mark 923 may pass through the second insulating layer 621 to be coupled to the first upper contact plug 911.

The first align mark 923 and the second contact plugs 623 may be formed at the same time. The second contact plugs 623 and the first align mark 923 may include conductive materials.

Referring to FIG. 18B, the second insulating structure IS2' may be formed on the first insulating structure IS1'. The second insulating structure IS2' may include the third insulating layer 627 and the third insulating layer 627 may include an oxide layer. The second insulating structure IS2' may extend to cover the second contact plugs 623 and the first align mark 923.

Subsequently, the first conductive contact patterns 633 passing through the second insulating structure IS2' may be formed. The first conductive contact patterns 633 may be formed using the processes described above with reference to FIG. 8C. The first conductive contact patterns 633 may include copper.

Subsequently, a part of the first substrate 600 may be etched from the rear surface of the first substrate 600. Accordingly, the first contact pad 903 may be exposed and the first substrate 601 with the reduced thickness may remain as illustrated in FIG. 18C.

Figure 19A:
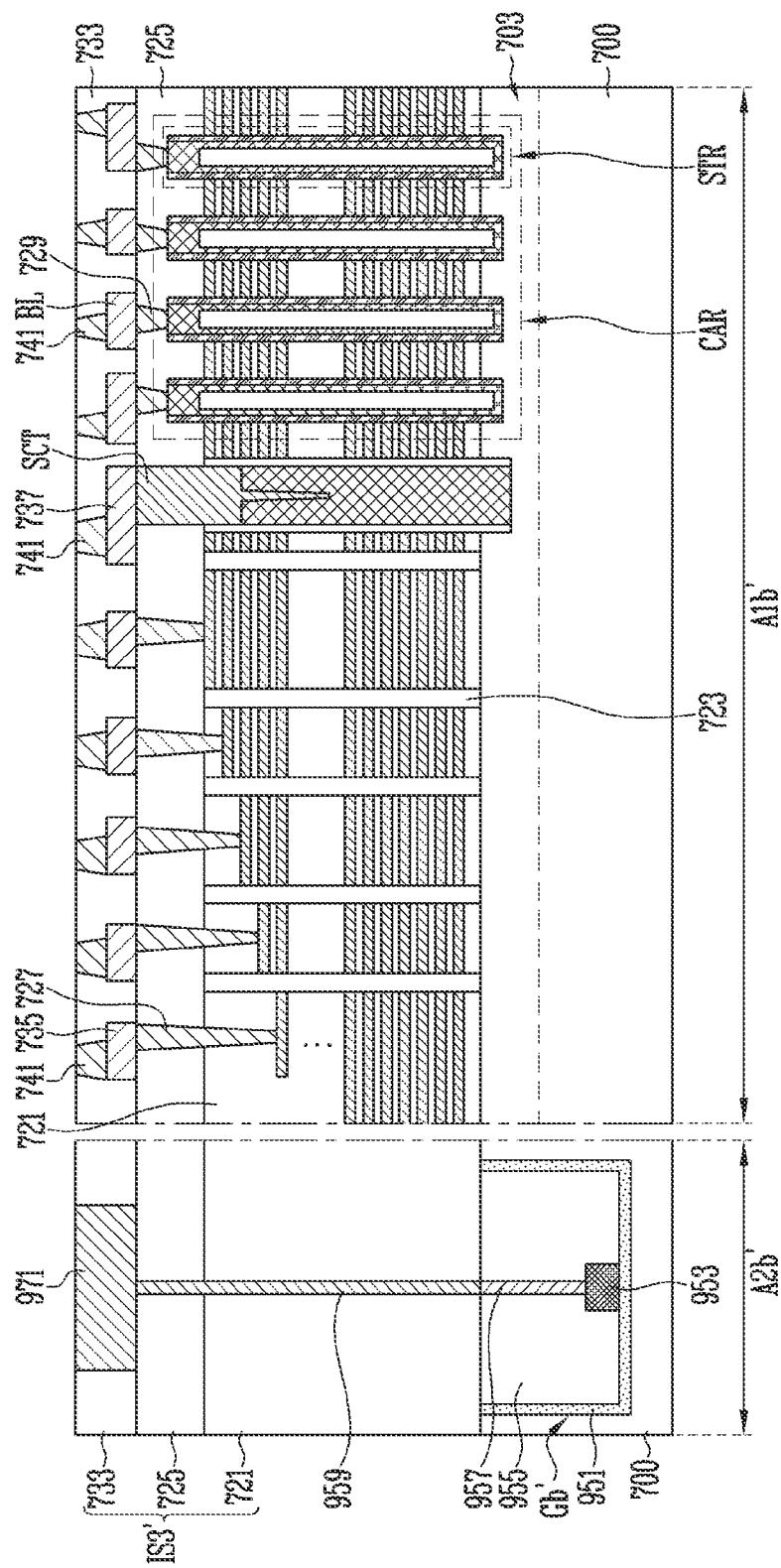
Figure 19B:
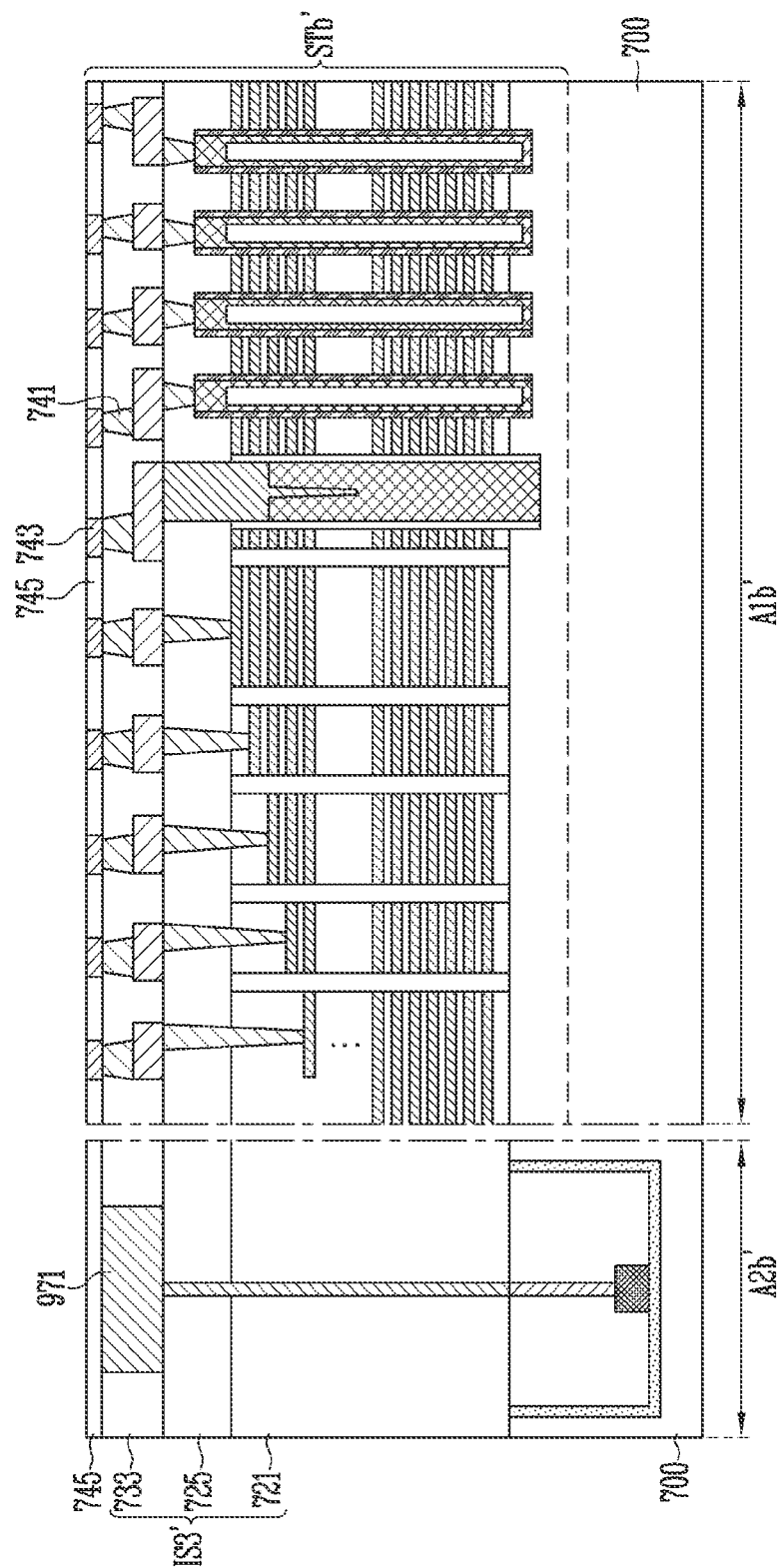

FIGS. 19A to 19C are cross-sectional diagrams illustrating processing a second substrate to have a second structure and a second align mark.

Referring to FIG. 19A, the second substrate 700 may include the same material as the second substrate 151 described above with reference to FIG. 1B. The second substrate 700 may include the first region A1b' and the second region A2b'.

A second groove Gb' may be formed at the second region A2b' of the second substrate 700. A second lower etch stop layer 951, a second contact pad 953, a second gap-fill insulating layer 955, and a second lower contact plug 957 may be disposed in the second groove Gb'. The second lower etch stop layer 951, the second contact pad 953, the second gap-fill insulating layer 955, and the second lower contact plug 957 may be formed using the processes described above with reference to FIG. 16A.

As described above with reference to FIG. 16B, the memory cell array CAR including the memory strings STR coupled to the source region 703 may be formed over the first region A1b' of the second substrate 700.

Subsequently, the supports 723, the fourth insulating layer 721, the fifth insulating layer 725, the source contact structure SCT, the gate contact plugs 727, and the drain contact plugs 729 described above with reference to FIG. 16B may be formed.

A second upper contact plug 959 passing through the fourth insulating layer 721 and the fifth insulating layer 725 disposed at the second region A2b' of the second substrate 700 may be formed. The second upper contact plug 959 may extend to contact the second lower contact plug 957. The second upper contact plug 959 may include a conductive material.

Subsequently, the gate pads 735, the source pad 737, and the bit lines BL may be formed on the fifth insulating layer 725 in the same manner as described above with reference to FIG. 16C.

Subsequently, the sixth insulating layer 733 covering the gate pads 735, the source pad 737, and the bit lines BL may be formed. The sixth insulating layer 733 may extend over the second region A2b' of the second substrate 700. Accordingly, the third insulating structure IS3' including the fourth, fifth, and sixth insulating layers 721, 725, and 733 may be formed.

Subsequently, a second align mark 971 and the pad contact plugs 741 that pass through the sixth insulating layer 733 may be formed. The second align mark 971 and the pad contact plugs 741 may be formed by the same process and may include the same conductive material. The second align mark 971 may extend to contact the second upper contact plug 959. The pad contact plugs 741 may extend to contact the gate pads 735, the source pad 737, and the bit lines BL.

Referring to FIG. 19B, the upper insulating layer 745 may be formed on the third insulating structure IS3'. Subsequently, the second conductive contact patterns 743 passing through the upper insulating layer 745 may be formed as described above with reference to FIG. 16D.

Subsequently, a part of the second substrate 700 may be etched from the rear surface of the second substrate 700. Accordingly, the second contact pad 953 may be exposed and the second substrate 701 with the reduced thickness may remain as illustrated in FIG. 19C.

Figure 20:
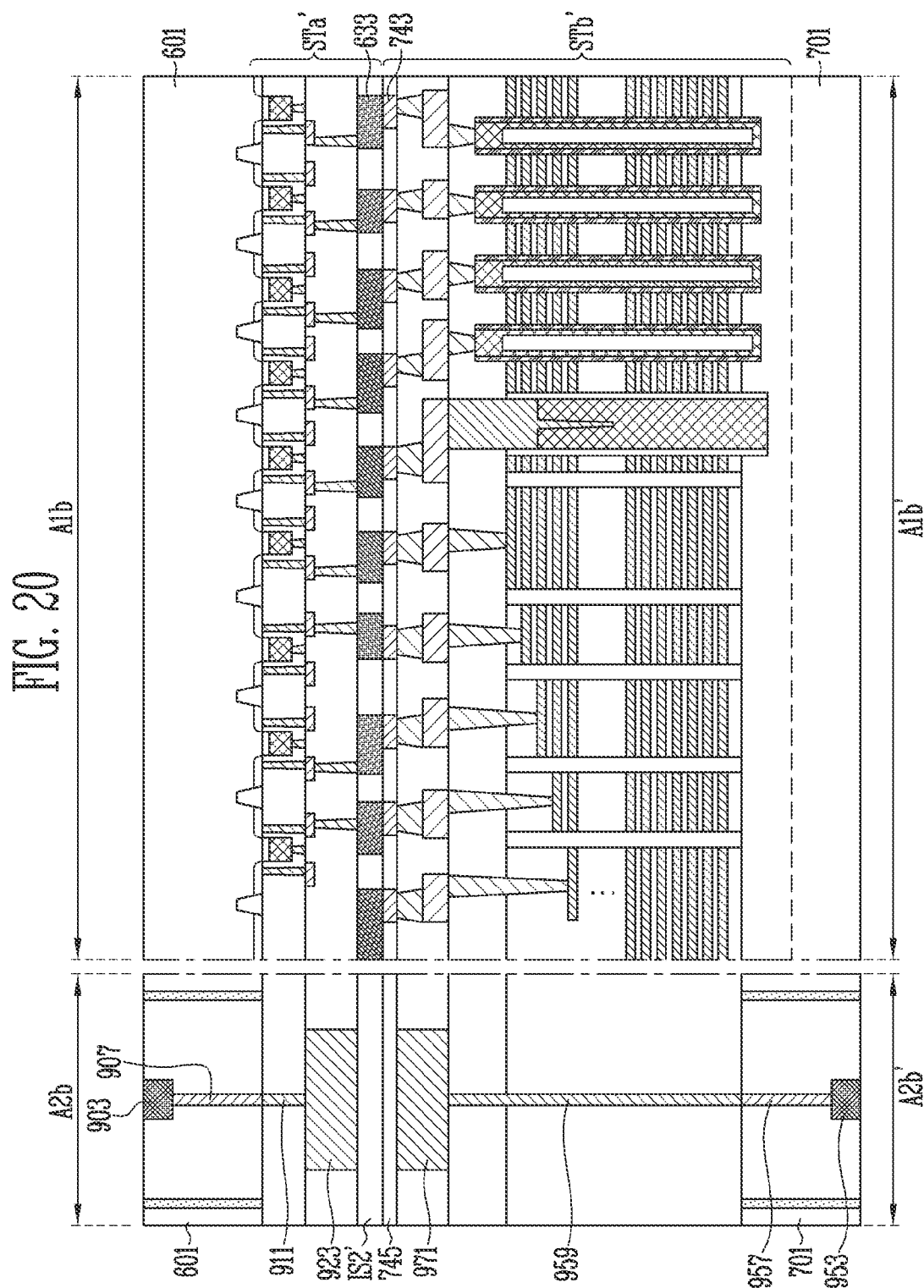

FIG. 20 is a cross-sectional diagram illustrating aligning the first substrate 601 with the reduced thickness and the second substrate 701 with the reduced thickness with each other.

Referring to FIG. 20, the first substrate 601 with the reduced thickness and the second substrate 701 with the reduced thickness may be orientated such that the first conductive contact patterns 633 and the second conductive contact patterns 743 face each other. Capacitance between the first align mark 923 and the second align mark 971 may be measured.

The first align mark 923 and the second align mark 971 may be aligned to overlap each other. When capacitance between the first align mark 923 and the second align mark 971 is measured to have a reference value, such that it is determined that the first substrate 601 and the second substrate 701 are correctly aligned, the first conductive contact patterns 633 may be coupled to the second conductive contact patterns 743. Accordingly, the first structure STa' and the second structure STb' coupled to each other via the first conductive contact patterns 633 and the second conductive contact patterns 743 may be formed as illustrated in FIG. 11. The first conductive contact patterns 633 and the second conductive contact patterns 743 may be treated by heat to couple the first structure STa' and the second structure STb'.

Capacitance between the first align mark 923 and the second align mark 971 may be measured by applying electrical signals through the first contact pad 903 and the second contact pad 953. The signal applied to the first contact pad 903 may be applied to the first align mark 923 via the first lower contact plug 907 and the first upper contact plug 911. The signal applied to the second contact pad 953 may be applied to the second align mark 971 via the second lower contact plug 957 and the second upper contact plug 959.

After the first structure STa' and the second structure STb' are coupled to each other, the second region A2b of the first substrate 601 and the second region A2b' of the second substrate 701 may be removed by a cutting process.

Although not illustrated in detail, a manufacturing process consistent with embodiments described above with reference to FIGS. 18A to 18C, 19A to 19C, and 20 may be used to form the semiconductor memory device shown in FIGS. 7A to 7C.

Figure 21:
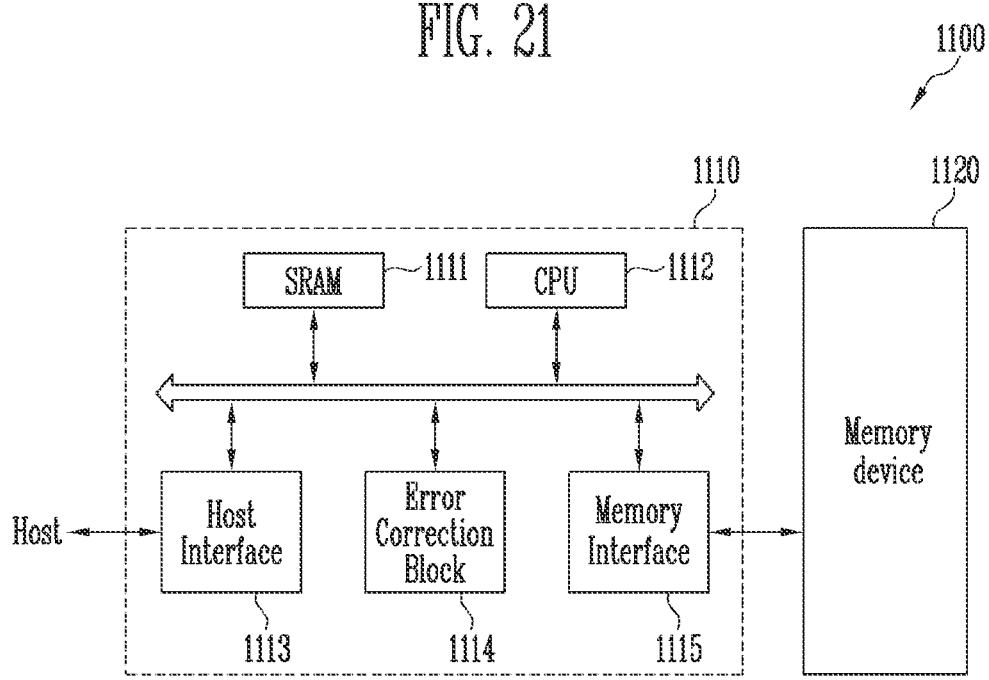
FIG. 21 is a block diagram illustrating the configuration of a memory system according to an embodiment.

FIG. 21 is a block diagram illustrating the configuration of a memory system 1100 according to an embodiment.

Referring to FIG. 21, the memory system 1100 may include a memory device 1120 and a memory controller 1110.

The memory device 1120 may be a multi-chip package including a plurality of flash memory chips. The memory device 1120 may include one of the semiconductor memory devices illustrated in FIGS. 7A to 7C and 11.

The memory controller 1110 may be configured to control the memory device 1120 and include Static Random Access Memory (SRAM) 1111, a CPU 1112, a host interface 1113, an error correction block 1114, and a memory interface 1115. The SRAM 1111 may serve as an operating memory of the CPU 1112, the CPU 1112 may perform a control operation for data exchange of the memory controller 1110, and the host interface 1113 may include a data exchange protocol of a host accessing the memory system 1100. In addition, the error correction block 1114 may detect and correct errors included in the data read from the memory device 1120, and the memory interface 1115 may perform interfacing with the memory device 1120. In addition, the memory controller 1110 may further include Read Only Memory (ROM) for storing code data for interfacing with the host.

The memory system 1100 having the above-described configuration may be a Solid State Drive (SSD) or a memory card in which the memory device 1120 and the memory controller 1110 are combined. For example, when the memory system 1100 is an SSD, the memory controller 1110 may communicate with an external device (e.g., a host) through one of the interface protocols including a Universal Serial Bus (USB), a MultiMedia Card (MMC), Peripheral Component Interconnection-Express (PCI-E), Serial Advanced Technology Attachment (SATA), Parallel Advanced Technology Attachment (PATA), a Small Computer Small Interface (SCSI), an Enhanced Small Disk Interface (ESDI), and Integrated Drive Electronics (IDE).

Figure 22:
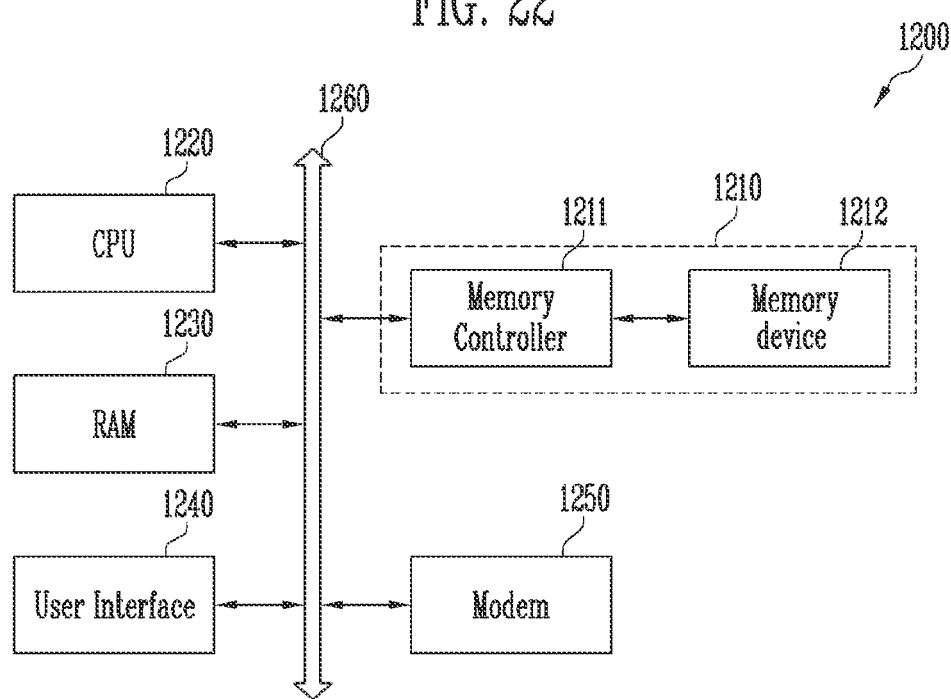
FIG. 22 is a block diagram illustrating the configuration of a computing system according to an embodiment.

FIG. 22 is a block diagram illustrating the configuration of a computing system 1200 according to an embodiment.

Referring to FIG. 22, the computing system 1200 may include a CPU 1220, Random Access Memory (RAM) 1230, a user interface 1240, a modem 1250, and a memory system 1210 that are electrically coupled to a system bus 1260. In addition, when the computing system 1200 is a mobile device, a battery for supplying an operating voltage to the computing system 1200 may be further included, an application chipset, a camera image processor (CIS), a mobile DRAM, and the like may be further included.

According to the present teachings, alignment accuracy between a first substrate and a second substrate may be improved by using a first align mark included with the first substrate and a second align mark included with the second substrate. Accordingly, the alignment stability between a memory cell array and a peripheral circuit may be increased when the memory cell array formed on one substrate and the peripheral circuit formed on another substrate are coupled.

What is claimed is:
1. A method of manufacturing a semiconductor memory device, the method comprising:
forming a first align mark and a peripheral circuit over a first substrate;
forming a second align mark and a memory cell array over a second substrate;

orientating the first substrate and the second substrate such that the peripheral circuit and the memory cell array face each other; and aligning and coupling the peripheral circuit with the memory cell array, wherein aligning the peripheral circuit with the memory cell array comprises measuring capacitance between the first align mark and the second align mark.

2. The method of claim 1, wherein the first align mark comprises first capacitor electrodes spaced apart from each other,
wherein the second align mark comprises second capacitor electrodes spaced apart from each other, and
wherein when the first capacitor electrodes and the second capacitor electrodes are alternately arranged in a direction substantially perpendicular to the coupling direction, and
wherein the peripheral circuit and the memory cell array are coupled when capacitances between the first capacitor electrodes and the second capacitor electrodes neighboring each other is measured to have a reference value.

3. The method of claim 1, wherein when the first align mark and the second align mark are aligned to overlap each other, and the peripheral circuit and the memory cell array are coupled when the capacitance is measured to have a reference value.

4. The method of claim 1, wherein the forming the first align mark and the peripheral circuit over the first substrate comprises:
forming a groove by etching the first substrate;
forming a contact pad in the groove;
forming a gap-fill insulating layer to cover the contact pad and fill the groove;
forming a lower contact plug passing through the gap-fill insulating layer and coupled to the contact pad;
forming an upper contact plug coupled to the lower contact plug on a first surface of the first substrate when the peripheral circuit is formed;
forming an insulating structure on the first surface of the first substrate to cover the peripheral circuit, the lower contact plug, and the upper contact plug; and
forming a conductive contact pattern coupled to the peripheral circuit and forming the first align mark coupled to the upper contact plug.

5. The method of claim 4, further comprising, before aligning the peripheral circuit with the memory cell array, exposing the contact pad by removing a part of the first substrate from a rear surface of the first substrate opposite the first surface of the first substrate,
wherein measuring the capacitance between the first align mark and the second align mark comprises applying an electrical signal to the contact pad.

6. The method of claim 1, wherein forming the second align mark and the memory cell array over the second substrate comprises:
forming a groove by etching the second substrate;
forming a contact pad in the groove;
forming a gap-fill insulating layer to cover the contact pad and fill the groove;
forming a lower contact plug passing through the gap-fill insulating layer and coupled to the contact pad;
forming the memory cell array on a first surface of the second substrate, wherein the memory cell array includes channel structures that pass through alternately stacked interlayer insulating layers and conductive patterns and includes memory layers that are disposed between the channel structures and the conductive patterns;
forming an insulating structure covering the memory cell array and the lower contact plug;
forming an upper contact plug passing through the insulating structure and coupled to the lower contact plug and forming a connection structure coupled to the memory cell array; and
forming a conductive contact pattern coupled to the connection structure, and forming the second align mark coupled to the upper contact plug.

7. The method of claim 6, further comprising, before aligning the peripheral circuit with the memory cell array, exposing the contact pad by removing a part of the second substrate from a rear surface of the second substrate opposite the first surface of the second substrate,
wherein measuring the capacitance between the first align mark and the second align mark comprises applying an electrical signal to the contact pad.

\* \* \* \* \*